(12) United States Patent
Bu et al.

(10) Patent No.: US 11,815,588 B2
(45) Date of Patent: Nov. 14, 2023

(54) ROOM-TEMPERATURE SEMICONDUCTOR MASER AND APPLICATIONS THEREOF

(71) Applicant: University of Electronic Science and Technology of China, Chengdu (CN)

(72) Inventors: Shirong Bu, Chengdu (CN); Liu Chen, Chengdu (CN); Cheng Zeng, Chengdu (CN); Junsong Ning, Chengdu (CN); Zhanping Wang, Chengdu (CN); Yang Fu, Chengdu (CN); Ruyi Wang, Chengdu (CN); Chenle Wang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 786 days.

(21) Appl. No.: 16/920,781

(22) Filed: Jul. 6, 2020

(65) Prior Publication Data

US 2021/0003688 A1   Jan. 7, 2021

(30) Foreign Application Priority Data

Jul. 5, 2019  (CN) .......................... 201910604006.2
Jul. 5, 2019  (CN) .......................... 201910604008.1
Jul. 5, 2019  (CN) .......................... 201910604297.5
Jul. 5, 2019  (CN) .......................... 201910604857.7
Jul. 5, 2019  (CN) .......................... 201910605598.X

(51) Int. Cl.
*G01S 13/08*   (2006.01)
*H03H 7/38*    (2006.01)
(Continued)

(52) U.S. Cl.
CPC .......... *G01S 13/08* (2013.01); *G06K 7/10366* (2013.01); *G06K 19/0708* (2013.01);
(Continued)

(58) Field of Classification Search
CPC ............... G01S 13/08; G06K 7/10366; G06K 19/0708; G06K 19/0723; H01P 1/38; H01S 1/00; H01S 5/042; H01S 5/009; H01S 5/018; H01S 5/036; H03F 1/56; H03F 3/19; H03F 2200/222; H03H 7/38
See application file for complete search history.

(56) References Cited

U.S. PATENT DOCUMENTS 5,086,282 A * 2/1992 Aina ....................... H03F 3/345
                                                         257/E27.012
5,263,198 A * 11/1993 Geddes ..................... H04B 1/28
                                                         455/325

(Continued)

*Primary Examiner* — Peter M Bythrow
(74) *Attorney, Agent, or Firm* — MATTHIAS SCHOLL P.C.; Matthias Scholl

(57) ABSTRACT

A room-temperature semiconductor maser, including a first matching network, a second matching network, a heterojunction-containing transistor, and a resonant network. The output end of the first matching network is connected to the drain of the heterojunction-containing transistor. The input end of the second matching network is connected to the source of the heterojunction-containing transistor. The gate of the heterojunction-containing transistor is connected to the resonant network. The pumped microwaves are fed into the input end of the first matching network.

22 Claims, 39 Drawing Sheets

(51) Int. Cl.
*H01S 1/00* (2006.01)
*H01S 5/042* (2006.01)
*H03F 3/19* (2006.01)
*H03F 1/56* (2006.01)
*G06K 19/07* (2006.01)
*G06K 7/10* (2006.01)
*H01P 1/38* (2006.01)
*H01S 5/50* (2006.01)

(52) U.S. Cl.
CPC ............ *G06K 19/0723* (2013.01); *H01P 1/38* (2013.01); *H01S 1/00* (2013.01); *H01S 5/042* (2013.01); *H01S 5/5009* (2013.01); *H01S 5/5018* (2013.01); *H01S 5/5036* (2013.01); *H03F 1/56* (2013.01); *H03F 3/19* (2013.01); *H03H 7/38* (2013.01); *H03F 2200/222* (2013.01)

(56) References Cited

U.S. PATENT DOCUMENTS

| | | | |
|---|---|---|---|
| 6,265,945 B1* | 7/2001 | Delaney | G04F 5/145 331/3 |
| 7,323,941 B1* | 1/2008 | Happer | G01R 33/26 331/3 |
| 8,779,489 B2* | 7/2014 | de Rochemont | H01L 29/42376 257/296 |
| 8,906,470 B2* | 12/2014 | Overstolz | G04F 5/14 427/372.2 |
| 9,160,286 B2* | 10/2015 | Kalantari | H03F 3/19 |
| 10,116,290 B1* | 10/2018 | Wang | H03L 7/093 |
| 10,587,226 B2* | 3/2020 | Ahmed | H03F 1/0288 |
| 10,601,380 B2* | 3/2020 | Chen | H03F 3/19 |
| 10,735,108 B2* | 8/2020 | Tuo | H04B 1/44 |
| 11,303,087 B1* | 4/2022 | Amarloo | H01S 3/0602 |
| 11,469,566 B1* | 10/2022 | Amarloo | H03L 7/26 |
| 2005/0007118 A1* | 1/2005 | Kitching | H03L 7/26 324/464 |
| 2007/0001773 A1* | 1/2007 | Oxborrow | H01P 7/10 331/154 |
| 2007/0087719 A1* | 4/2007 | Mandal | H01Q 1/22 455/299 |
| 2007/0247241 A1* | 10/2007 | Braun | G04F 5/14 331/94.1 |
| 2010/0059792 A1* | 3/2010 | Shur | H01S 3/094 257/E29.246 |
| 2010/0203847 A1* | 8/2010 | Gorbachov | H03H 7/38 455/84 |
| 2012/0076164 A1* | 3/2012 | Walther | H01L 31/0352 257/14 |
| 2012/0223354 A1* | 9/2012 | Hayat | H01S 5/34 257/E33.072 |
| 2013/0207725 A1* | 8/2013 | Afshari | H03G 3/00 330/144 |
| 2015/0103859 A1* | 4/2015 | Breeze | H01P 7/08 372/82 |
| 2016/0178843 A1* | 6/2016 | Fujita | H01Q 1/00 385/14 |
| 2017/0077877 A1* | 3/2017 | Anderson | H03F 1/0261 |
| 2018/0069372 A1* | 3/2018 | Maki | H01S 5/06804 |
| 2019/0187198 A1* | 6/2019 | Anderson | G01R 29/0878 |
| 2021/0091526 A1* | 3/2021 | Breeze | H01S 1/02 |
| 2021/0138257 A1* | 5/2021 | Dolgoff | A61B 6/032 |
| 2021/0156898 A1* | 5/2021 | Amarloo | G01R 33/032 |
| 2021/0286063 A1* | 9/2021 | Amarloo | G01S 7/4816 |

\* cited by examiner $U=0.02V$, $fr=64.547MHz$

U=0.03V, fr=65.047MHz

U=0.04V, fr=65.547MHz

ROOM-TEMPERATURE SEMICONDUCTOR MASER AND APPLICATIONS THEREOF

CROSS-REFERENCE TO RELATED APPLICATIONS

Pursuant to 35 U.S.C. § 119 and the Paris Convention Treaty, this application claims foreign priority to Chinese Patent Application No. 201910604006.2 filed Jul. 5, 2019, to Chinese Patent Application No. 201910604008.1 filed Jul. 5, 2019, to Chinese Patent Application No. 201910604297.5 filed Jul. 5, 2019, to Chinese Patent Application No. 201910604857.7 filed Jul. 5, 2019, and to Chinese Patent Application No. 201910605598.X filed Jul. 5, 2019. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure belongs to the technical field of quantum mechanics, semiconductor physics and electronics, and more particularly to a room-temperature semiconductor maser based on the energy level characteristics of a heterojunction-containing transistor and applications thereof.

A maser, an acronym for microwave amplification by stimulated emission of radiation, is a device that produces coherent electromagnetic waves through amplification by stimulated emission. Masers are used as the timekeeping device in atomic clocks, and as extremely low-noise microwave amplifiers in radio telescopes and ground stations for deep-space communication.

FIG. 1 shows a room temperature solid state maser, and FIG. 2 shows a continuous wave room temperature diamond maser. At present, there is no circuit or method, based on the energy level characteristics of semiconductor transistors, to realize room-temper conductor maser using microwave electromagnetic energy as pumping.

SUMMARY

A room-temperature semiconductor maser is provided, comprising a first matching network, a second matching network, a heterojunction-containing transistor and a resonant network. An output end of the first matching network is connected to a drain of the heterojunction-containing transistor; an input end of the second matching network is connected to a source of the heterojunction-containing transistor; a gate of the heterojunction-containing transistor is connected to the resonant network; and, pumped microwaves are fed into an input end of the first matching network.

Further, the heterojunction-containing transistor can be a heterojunction bipolar transistor or a field effect transistor (FET); the FET can be a metal-oxide semiconductor field effect transistor (MOSFET) or a high electron mobility transistor (HEMT).

In the room-temperature semiconductor maser according to the disclosure, the pumped microwaves are fed into the heterojunction-containing transistor through the first matching network to excite polaritons in the energy level of the heterojunction-containing transistor to a higher energy level. The resonant network provides a specified energy path at its resonant frequency, so that the polaritons excited to the higher energy level transition down to a specified energy level in an energy level region to radiate electromagnetic waves and then transition to a ground-state energy level from the specified energy level to radiate electromagnetic waves.

Further, the specified energy level in the energy level region is adjusted by the resonant network to satisfy the requirements on the radiation of electromagnetic waves in practical applications.

Further, the polaritons excited to the higher energy level firstly transition to the specified energy level, and then transition to the ground-state energy level from the specified energy level. When the polaritons excited to the higher energy level transition to the specified energy level, the frequency of generated microwaves by radiation is determined by the frequency of feeding pumped microwaves and the resonant frequency of the resonant network; and, when the polaritons excited to the higher energy level transition to the ground-state energy level from the specified energy level, the frequency of generated microwaves by radiation is equal to the resonant frequency of the resonant network.

A passive frequency mixer based on a room-temperature semiconductor maser is provided, as shown in FIG. 5A, comprising a local oscillator (LO) filter and its matching network A, a band-pass filter and its matching network D, a heterojunction-containing transistor B, and a low-pass filter and its matching network C. The LO filter and an output end of its matching network are connected to a drain of the heterojunction-containing transistor; the low-pass filter and an input end of its matching network are connected to a source of the heterojunction-containing transistor; and, a gate of the heterojunction-containing transistor is connected to the band-pass filter and its matching network.

Further, the heterojunction-containing transistor can be a heterojunction bipolar transistor, a field effect transistor (FET) or the like. The FET can be a metal-oxide semiconductor field effect transistor (MOSFET) or a high electron mobility transistor (HEMT).

In the passive frequency mixer based on a room-temperature semiconductor maser according to the disclosure, the pumped microwave input LO frequency $f_p$ is fed into the heterojunction-containing transistor through the LO filter and its matching network to excite polaritons in the heterojunction-containing transistor to a higher energy level. The input signal frequency $f_r$ is fed into the heterojunction-containing transistor through the band-pass filter and its matching network, so that the polaritons excited to the higher energy level transition down to a specified energy level in an energy level region. A frequency $f_a$ is output. Thus, signal frequency mixing is realized.

When the polaritons excited to the higher energy level transition down to a specified energy level in the energy level region, the frequency $f_a$ is output, and the position of the specified energy level is determined by the input signal frequency $f_r$. When the polaritons excited to the higher energy level transition down to a ground-state energy level from the specified energy level, the frequency $f_r$ is output.

The polaritons excited to the higher energy level firstly transition down to the specified energy level, and then transition down to the ground-state energy level from the specified energy level. When the polaritons transition down from the higher energy level, the polaritons release energy to drive more polaritons to transition down, resulting in a chain reaction. This microscopic phenomenon is macroscopically reflected by the fact that the frequency mixer implemented by this method has a gain and the gain is related to the power of the pumped microwaves.

The disclosure further provides an application of the room-temperature semiconductor maser as a radio-frequency microwave oscillator. The resonant frequency of a resonant network which plays a feedback role in the oscillator is controlled according to the power of the input pumped microwaves so as to realize stable oscillation output.

Further, a threshold is set for the power of the input pumped microwaves. That is, oscillation will occur when the power of the pumped microwaves is higher than a certain value or less than another certain value.

When the room-temperature semiconductor maser is applied as a radio-frequency microwave oscillator, the pumped microwaves excite polaritons in a heterojunction-containing transistor to a higher energy level, and the resonant frequency of the resonant network which plays a feedback role in the oscillator is controlled according to the power of the input pumped microwaves, so that the polaritons excited to the higher energy level firstly transition to a specified energy level in an energy level region and then transition to a ground-state energy level, so as to realize stable oscillation output. The specified energy level is adjusted by the resonant frequency of the resonant network. The resonant network contains the junction capacitance inside the transistor. The power of the input pumped microwaves controls the resonant frequency of the resonant network by changing the junction capacitance.

Further, when the polaritons excited to the higher energy level firstly transition to the specified energy level in the energy level region, and the oscillation frequency generated by radiation is determined by the frequency of feeding pumped microwaves and the resonant frequency; and, when the polaritons excited to the higher energy level transition to the ground-state energy level from the specified energy level, the oscillation frequency generated by radiation is the resonant frequency of the resonant network.

Further, the operating principle of the radio-frequency microwave oscillator will be described below. The resonant frequency of the resonant network will be changed by pumped microwaves with different power. In accordance with the formula p·t=h·$f_p$·n (where n represents the number of excited polaritons, t is the time, and h is the Planck constant), if the frequency $f_p$ of the pumped microwaves remains unchanged, when the power p increases, and the capacitance value decreases. In accordance with the relationship $$f_r = \frac{1}{2\pi}\sqrt{1/L\cdot C}$$

of the resonant frequency of the resonant network, the decrease in the capacitance value will result in the increase in the resonant frequency.

The disclosure further provides a frequency stabilization method based on a room-temperature semiconductor maser; stable oscillation output can be obtained when the power of the fed pumped microwaves is a constant value in the stable frequency range of the heterojunction-containing transistor.

The principle of the frequency stabilization will be described below. Polaritons in a heterojunction-containing transistor are excited to a higher energy level by pumped microwaves received by a transmission line or an external antenna, and a resonant network provides a specified energy path at its resonant frequency, so that the polaritons excited to the higher energy level transition to a specified energy level in an energy level region so as to realize stable oscillation output.

The frequency of the fed pumped microwaves should be high enough, so that the energy of the pumped microwaves is high enough to excite the polaritons in the heterojunction-containing transistor to the higher energy level.

When the power of the fed pumped microwaves is a constant value, the oscillation output frequency can be controlled by the pumping frequency, that is, the oscillator has a certain tunable bandwidth. As shown in FIG. 8, when the power of the fed pumped microwaves is a constant value in the stable frequency range, the oscillation output from the oscillator can have the best frequency stability and phase noise, i.e., can realize frequency stabilization.

The disclosure further provides an application of the frequency stabilization method based on a room-temperature semiconductor maser in clock distribution.

Further, a stable clock signal is obtained by feeding, by a receiving antenna, pumped microwaves having a power that is a constant value in the stable frequency range of a heterojunction-containing transistor; and, the stable clock signal is transmitted to each receiver by a transmitting antenna, so as to realize wireless clock distribution.

The disclosure further provides a microwave ranging system based on passive frequency conversion, as shown in FIGS. 14A-14B, comprising a master station instrument and a passive slave station instrument. The master station instrument comprises a signal source 1, an isolator 2, a power amplifier 3, a duplexer 4, a low-noise amplifier 5, a frequency detector 6 and a master station instrument antenna 7; the signal source generates a microwave signal; the microwave signal is passed through the isolator and is then input into the power amplifier for amplification; the amplified signal is input into a first passband port of the duplexer; a main port of the duplexer is connected to the master station instrument antenna; a signal output from a second passband port is input into the low-noise amplifier; and a passive frequency conversion signal from the slave station instrument is amplified by the low-noise amplifier and then input into the frequency detector to detect the frequency; and the passive slave station instrument comprises a slave station instrument antenna 8 and a passive frequency conversion device 9; the slave station instrument antenna receives a signal from the master station instrument and transmits a frequency conversion signal generated by the passive frequency conversion device; the passive frequency conversion device comprises a first matching network, a second matching network, a heterojunction-containing transistor and a resonant network; an output end of the first matching network is connected to a drain of the heterojunction-containing transistor; an input end of the second matching network is connected to a source of the heterojunction-containing transistor; a gate of the heterojunction-containing transistor is grounded by the resonant network; and, the microwave signal transmitted by the master station instrument antenna is fed into the passive frequency conversion device.

Further, the frequency of the signal output from the passive frequency conversion device is determined according to the frequency and power of the microwaves from the master station instrument received by the slave station instrument antenna.

Furthermore, the distance between the master and slave station instruments can be calculated, according to the transmitted power Ps of the master station instrument antenna and the frequency of the frequency conversion signal generated by the slave station instrument and received by the master station instrument, by using a Friis transmission formula and a curve of the power of the passive frequency conversion device and the frequency.

Further, the frequency of the microwave signal generated by the signal source is 3 MHz to 40 GHz.

Further, the heterojunction-containing transistor can be a heterojunction bipolar transistor, a field effect transistor (FET) or the like. The FET can be a metal-oxide semiconductor field effect transistor (MOSFET) or a high electron mobility transistor (HEMT).

Further, in the passive frequency conversion device, the first matching network 11 functions to match the impedance of the antenna with the impedance of the drain of the transistor to more efficiently feed the signal transmitted by the master station instrument into the transistor; and, the second matching network 12 functions to match the impedance of the source with the impedance of the antenna to more efficiently transmit the output frequency conversion signal.

The operating principle of the microwave ranging system based on passive frequency conversion according to the disclosure will be described below.

The signal source generates a microwave signal; the microwave signal is passed through the isolator and is then input into the power amplifier for amplification; the amplified signal is input into a first passband port of the duplexer, and then transmitted by the master station instrument antenna connected to a main port of the duplexer; the slave station instrument antenna receives the signal transmitted by the master station instrument, and the signal is passed through the passive frequency conversion device to generate a frequency conversion signal; the generated frequency conversion signal is transmitted by the slave station instrument antenna, received by the master station instrument antenna and output by a second passband port of the duplexer; the signal output from the second passband port of the duplexer is input into the low-noise amplifier; and a passive frequency conversion signal from the slave station instrument is amplified by the low-noise amplifier and then input into the frequency detector to detect the frequency. Then, the distance between the master and slave station instruments can be calculated, according to the transmitted power Ps of the master station instrument antenna and the frequency of the frequency conversion signal generated by the slave station instrument and received by the master station instrument, by using a Friis transmission formula and a curve of the power of the passive frequency conversion device and the frequency.

The disclosure further provides a wireless DC-free sensing information transmission circuit, comprising a transceiving antenna, a drain matching circuit, an open-circuited line, a sensor, a heterojunction-containing transistor and a resonant network. One end of the drain matching circuit is connected to the transceiving antenna while the other end thereof is connected to a drain of the heterojunction-containing transistor, and a source of the heterojunction-containing transistor is connected to the open-circuited line, so that a modulated microwave signal generated by transition of polaritons is reflected to the drain matching circuit and transmitted by the transceiving antenna; a gate of the heterojunction-containing transistor is grounded by the resonant network; an output end of the sensor is connected between the drain matching circuit and the heterojunction-containing transistor; and, the drain matching circuit receives pumped microwaves through the transceiving antenna, and transmits the microwave signal modulated by sensing information to the transceiving antenna.

Further, the drain matching circuit matches the output impedance of the antenna with the impedance of the transistor, so that the pumped microwaves are fed into the transistor more efficiently and the microwave signal carrying the sensing information is more efficiently transmitted from the matching circuit, so as to realize the integrated transceiving antenna.

A method for implementing a wireless DC-free sensing information transmission circuit is provided, comprising: receiving a pumped microwave signal by a transceiving antenna, and feeding, by a drain matching circuit, the pumped microwave signal into a heterojunction-containing transistor; controlling the resonant frequency of a resonant network by changing the junction capacitance inside the heterojunction-containing transistor by an output voltage of a sensor, so that the heterojunction-containing transistor outputs a microwave signal modulated by sensing information and corresponding to the resonant frequency; and, match-reflecting the microwave signal by an open-circuited line, and transmitting the microwave signal by the heterojunction-containing transistor, the drain matching circuit and the transceiving antenna so as to realize the wireless DC-free transmission of the sensing information.

Further, the heterojunction-containing transistor can be a heterojunction bipolar transistor, a field effect transistor (FET) or the like. The FET can be a metal-oxide semiconductor field effect transistor (MOSFET) or a high electron mobility transistor (HEMT).

The disclosure further provides a reflective microwave amplifier, as shown in FIG. 22A, comprising a circulator, a source matching network, a pump matching network, a heterojunction-containing transistor and a tuning network. The circulator is connected to an input end, an output end and an input end of the source matching network; an output end of the source matching network is connected to a source of the heterojunction-containing transistor; a gate of the heterojunction-containing transistor is grounded by the tuning network; and the pump matching network is connected to a drain of the heterojunction-containing transistor; and an input signal is passed to the source matching network through the circulator and is then matched by the source matching network and fed into the heterojunction-containing transistor; pumped microwaves are fed into the heterojunction-containing transistor through the pump matching network, so that polaritons in the energy level of the heterojunction-containing transistor are excited to a higher energy level; the tuning network adjusts the resonant frequency according to the frequency of the signal to be amplified, so that the input signal can be amplified at a maximum amplification factor at low-noise; and, the amplified signal is passed through the source matching network and is then output from the output port of the circulator, so that the power of the input signal is amplified.

The resonant frequency of the tuning network is determined according to the frequency of the signal to be amplified.

A pass-type microwave amplifier is provided, as shown in FIG. 23A, comprising an input matching network, a heterojunction-containing transistor, a drain matching network, a tuning network, a duplexer, a pump matching network and an output matching network. The input matching network is connected to a source of the heterojunction-containing transistor, a gate of the heterojunction-containing transistor is grounded by the tuning network, and a drain of the heterojunction-containing transistor is connected to one end of the drain matching network; the other end of the drain matching network is connected to a general port of the duplexer; two branched ports of the duplexer are connected to the pump matching network and the output matching network, respectively; and an input signal is matched by the input matching network and then fed into the heterojunction-containing transistor; pumped microwaves are passed through the pump matching network and are then fed into the heterojunction-containing transistor, so that polaritons in the energy level of the heterojunction-containing transistor are excited to a higher energy level; the tuning network adjusts the resonant frequency according to the frequency of the signal to be amplified, so that the polaritons excited to the higher energy level transition to a lower energy level specified by the resonant frequency of the tuning network so as to radiate energy; due to the frequency of the input signal, stable excited radiation will occur during the transition of the polaritons excited to the higher energy level to the specified energy level, so that the signal is amplified at low-noise; and, the amplified signal is output by the output matching network, more efficiently.

The resonant frequency of the tuning network is determined according to the frequency of the signal to be amplified.

The pumped microwave is fed by the spatial radiation energy received by the antenna or by the microwave transmission line, directly.

Further, the heterojunction-containing transistor can be a heterojunction bipolar transistor, a field effect transistor (FET) or the like. The FET can be a metal-oxide semiconductor field effect transistor (MOSFET) or a high electron mobility transistor (HEMT).

In the reflective microwave amplifier and the pass-type microwave amplifier according to the disclosure, the polaritons in the energy level of the heterojunction-containing transistor are excited to a higher energy level by the pumped microwaves. Specifically, when excited by the pumped microwaves, lots of polaritons transition to a higher energy level, and the polaritons at this energy level can transition to an energy level specified by the resonant frequency of the tuning network at a high probability; and, when guided by the input signal at a frequency f, the polaritons transition to a lower energy level (i.e., the specified energy level) having an energy difference hf with the higher energy level, so as to release electromagnetic waves having the same frequency and phase as the input signal. With the increase in the power of the pumped microwaves, more and more polaritons participate in transition. When the energy of electromagnetic waves released by the polaritons that transition from the higher energy level to the lower energy level is greater than the energy absorbed by the transistor and the energy lost by the circuit, the input signal can be amplified. The gain of the amplifier is regulated by the power of the pumped microwaves.

The disclosure further provides an encoding method using a room-temperature semiconductor maser as an RFID single-frequency-point tag circuit based on transistor passive frequency conversion. The single-frequency-point tag circuit comprises a first matching network, a heterojunction-containing transistor, a second matching network and a resonant network; pumped microwaves are fed into an input end of the first matching network; an output end of the first matching network is connected to a drain of the heterojunction-containing transistor; a source of the heterojunction-containing transistor is connected to the second matching network; and the gate of the heterojunction-containing transistor is grounded by the resonant network; and by changing the resonant frequency of the resonant network, adjusting the frequency of output frequency points and corresponding to different tags, encoding is completed, and radio-frequency identification is realized.

The disclosure further provides an encoding method using a room-temperature semiconductor maser as an RFID single-frequency-point tag circuit based on transistor passive frequency conversion. The single-frequency-point tag circuit comprises a first matching network, a heterojunction-containing transistor, a second matching network and a resonant network; pumped microwaves are fed into an input end of the first matching network; an output end of the first matching network is connected to a drain of the heterojunction-containing transistor; a source of the heterojunction-containing transistor is connected to the second matching network; and the gate of the heterojunction-containing transistor is grounded by the resonant network; and pumped microwaves with same frequency and different power are input and passed through the heterojunction-containing transistor and the second matching network to output frequency points with different frequencies, and the frequency points correspond to different tags. In this way, encoding is completed, and radio-frequency identification is realized.

The disclosure further provides an encoding method based on an RFID multiple-frequency-point tag circuit based on transistor passive frequency conversion. The multiple-frequency-point tag circuit comprises a plurality of single-frequency-point tag circuits; each of the single-frequency-point tag circuits comprises a first matching network, a heterojunction-containing transistor, a second matching network and a resonant network; pumped microwaves are fed into an input end of the first matching network; an output end of the first matching network is connected to a drain of the heterojunction-containing transistor; a source of the heterojunction-containing transistor is connected to the second matching network; a gate of the heterojunction-containing transistor is grounded by the resonant network; each single-frequency-point tag circuit is encoded by one of the above two methods.

Further, the heterojunction-containing transistor can be a heterojunction bipolar transistor, a field effect transistor (FET) or the like. The FET can be a metal-oxide semiconductor field effect transistor (MOSFET) or a high electron mobility transistor (HEMT).

Further, the frequency of the pumped microwaves is 2.5 GHz to 40 GHz.

Further, different attenuators are additionally provided before the first matching network to input pumped microwaves with different power.

The disclosure further provides an application of the encoding method in direction finding; after the direction of an antenna is changed, the received signal is in one-to-one correspondence to the direction of the antenna, and the received signal is also in one-to-one correspondence to a target object, so that the direction of the target object is found.

Compared with the related art, the disclosure has the following beneficial effects.

1. The disclosure provides a room-temperature semiconductor maser; the polaritons in a heterojunction-containing transistor are excited to a higher energy level by pumped microwaves, and an energy path to a specified energy level is provided by a resonant network at its resonant frequency, so that the polaritons excited to the higher energy level transition down to the specified energy level, so as to realize stable microwave radiation. The disclosure effectively solves the problems of harsh requirements on the operating environment, large size, complicated process and the like, and realizes a room-temperature maser by using a heterojunction-containing transistor manufactured by a common semiconductor process. The structure is simple. The room-temperature maser can operate at the room temperature. Moreover, the threshold power is only 22 mW, and the efficiency is up to 5%.

2. The room-temperature semiconductor maser according to the disclosure is simple in structure, and can be applied in frequency mixers, oscillators, frequency stabilization, clock distribution, amplifiers, ranging systems, information sensing circuits and tag encoding.

BRIEF DESCRIPTION OF THE DRAWINGS

FIG. 5A is a structure diagram of a passive frequency mixer, and FIG. 5B is a structure diagram of a passive frequency mixer according to Example 1;

DETAILED DESCRIPTION

To facilitate those skilled in the art to understand the technical content of the disclosure, the disclosure is further explained in combination with the attached drawings.

Figure 1:
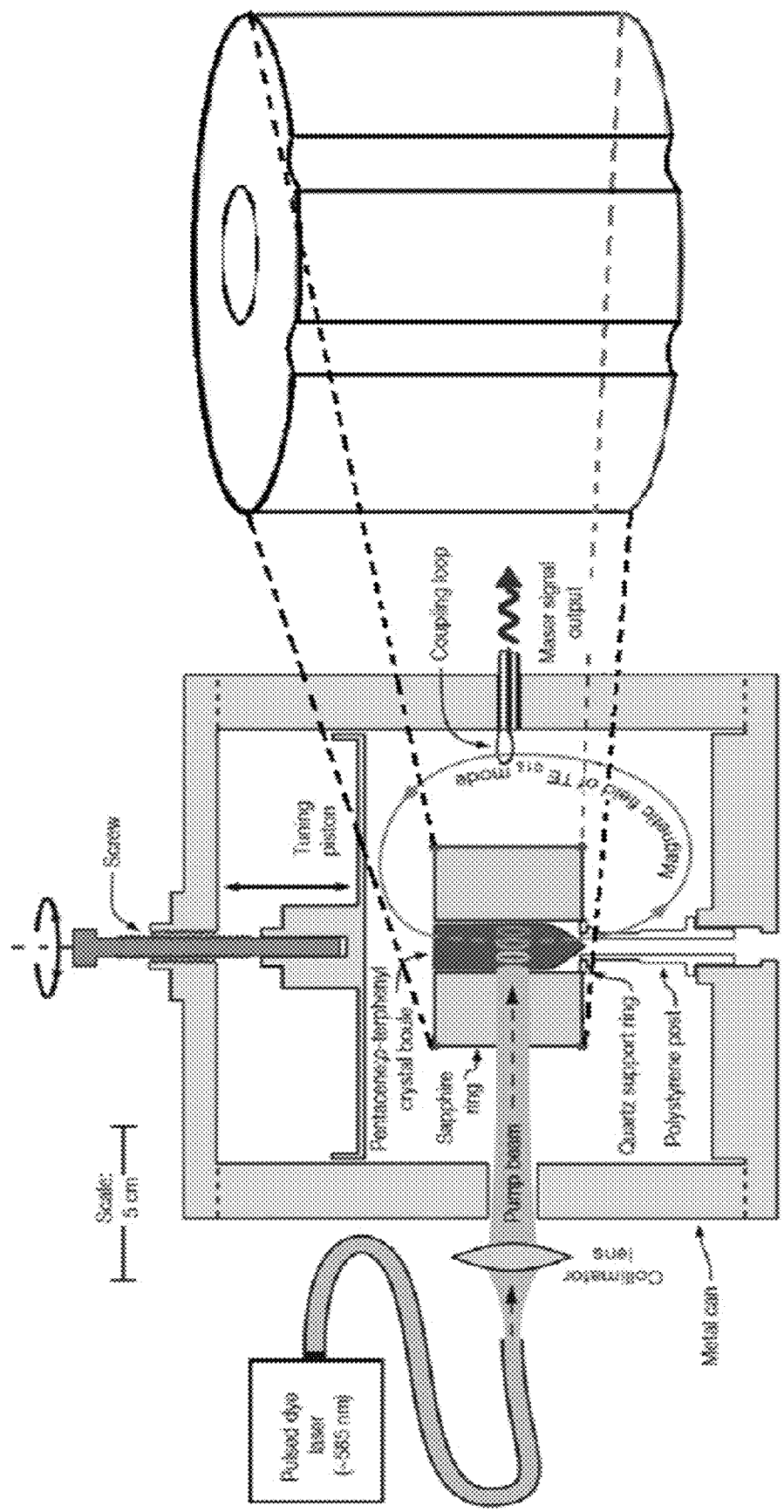
FIG. 1 is a schematic view of a room-temperature maser mentioned in the related art.
Figure 2:
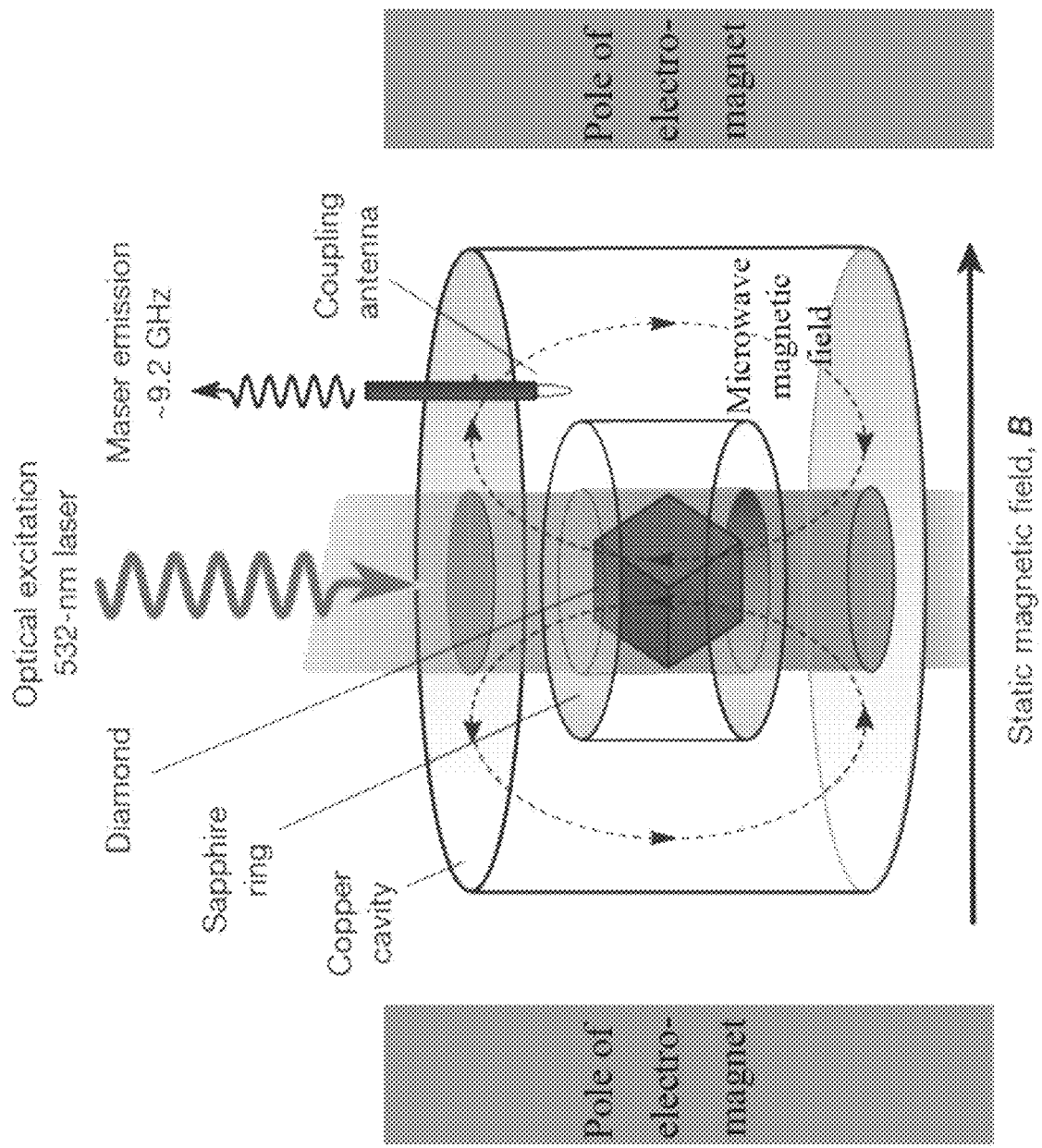
FIG. 2 is a schematic view of a room-temperature continuous-wave maser mentioned in the related art.
Figure 3:
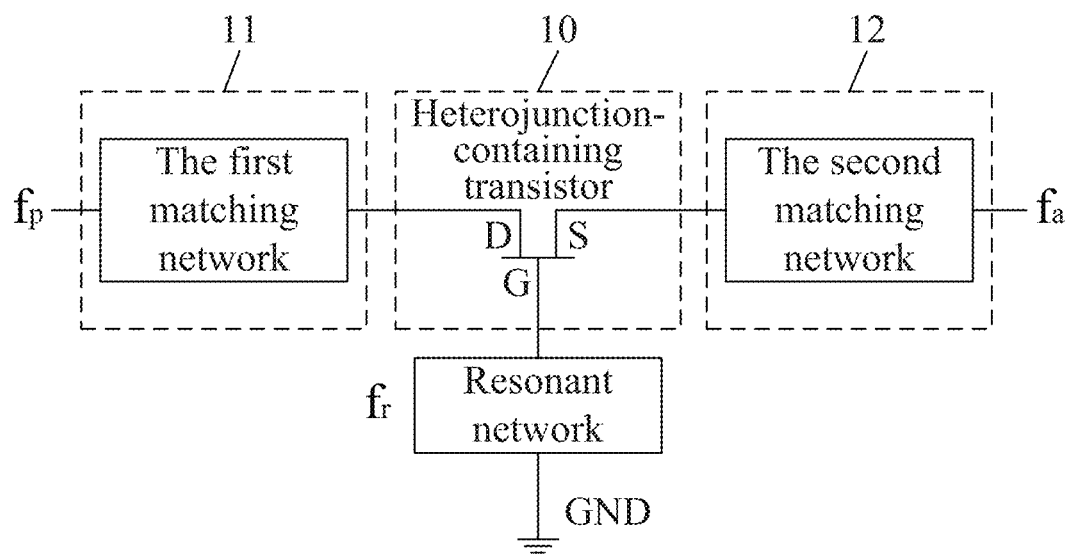
FIG. 3 is a schematic view of a room-temperature semiconductor maser according to the disclosure.

FIG. 3 shows a schematic view of a room-temperature semiconductor maser according to the disclosure. The room-temperature semiconductor maser comprises a first matching network 11, a second matching network 12, a heterojunction-containing transistor 10 and a resonant network. An output end of the first matching network 11 is connected to a drain of the heterojunction-containing transistor 10, an input end of the second matching network 12 is connected to a source of the heterojunction-containing transistor 10, and a gate of the heterojunction-containing transistor 10 is connected to the resonant network. Pumped microwaves are fed into an input end of the first matching network.

The first matching network 11 functions to match the impedance of the input end with the impedance of the drain of the heterojunction-containing transistor, so that the pumped microwaves can be fed into the heterojunction-containing transistor 10 more efficiently. The second matching network 12 functions to match the impedance of the source of the heterojunction-containing transistor with the impedance of the output port, so that the output microwave signal can be transmitted more efficiently.

Figure 4:
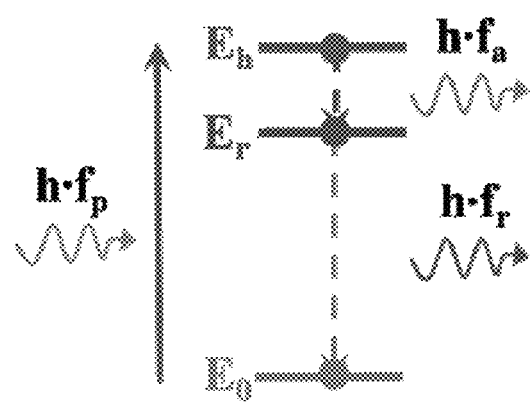
FIG. 4 shows the operating principle of a room-temperature semiconductor maser according to the disclosure.

FIG. 4 shows the operating principle of the room-temperature semiconductor maser according to the disclosure. During the operation of the maser device of the disclosure, polaritons in the ground-state energy level $E_0$ are excited to a higher energy level $E_h=E_0+h \cdot f_p$ (where h is the Planck constant, and $f_p$ is the pumping frequency). The energy is radiated when instable polaritons in the energy level $E_h$ transition down to a lower energy level. To realize stable energy radiation, an energy path to a specified energy path is provided by the resonant network at its resonant frequency $f_r$, as shown in FIG. 3, to provide a transition condition in the resonant circuit. Thus, the excited polaritons will have the maximum transition rate in the energy level $E_r=E_h \cdot h \cdot f_r = E_0 + h \cdot (f_p - f_r)$. Therefore, the polaritons firstly transition from $E_h$ to $E_r$ to generate a frequency $f_a=f_p-f_r$ by radiation, and then transition from $E_r$ to $E_0$ to generate a frequency $f_r$ by radiation.

The room-temperature semiconductor maser according to the disclosure is simple in structure, can operate at room temperature without a laser as a pump, and can be widely applied in fields of medicine, security, sensing, quantum technology and electronics.

Example 1

Figure 5A:
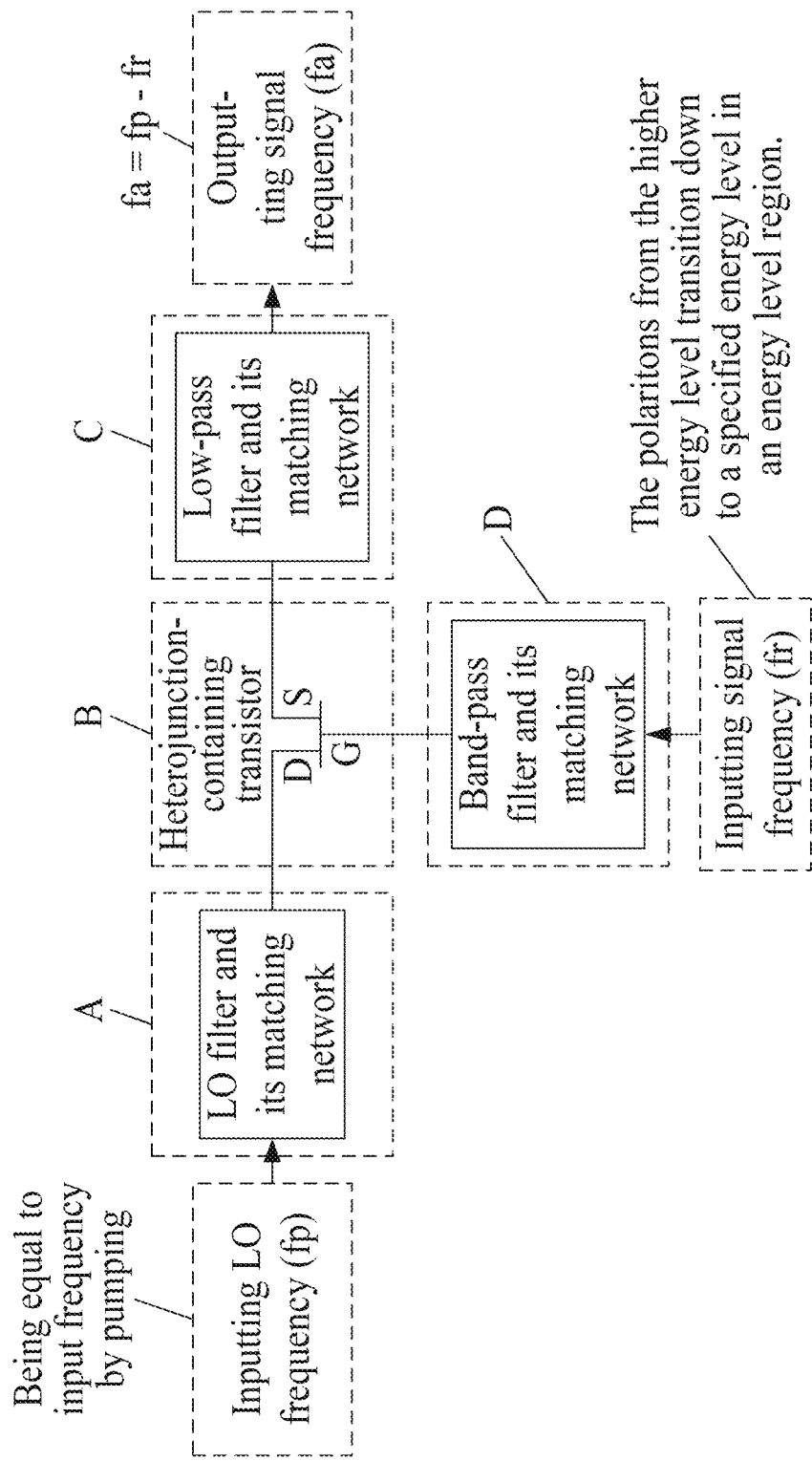
FIGS. 5A-5B are structure diagrams of a passive frequency mixer based on a room-temperature semiconductor maser according to the disclosure, where

This example provides an application of the room-temperature semiconductor maser of the disclosure in a passive frequency mixer. As shown in FIG. 5A, the passive frequency mixer comprises an LO filter and its matching network A, a band-pass filter and its matching network D, a heterojunction-containing transistor B, and a low-pass filter and its matching network C. The LO filter and an output end of its matching network are connected to a drain of the heterojunction-containing transistor, the low-pass filter and an input end of its matching network are connected to a source of the heterojunction-containing transistor, and a gate of the heterojunction-containing transistor is connected to the band-pass filter and its matching network. Pumped microwaves are fed into the LO filter and the input end of its matching network A, and a signal frequency $f_r$ is input into the band-pass filter and the input end of its matching network D.

The LO filter allows the $f_p$ signal to pass and blocks $f_r$ and $f_a$; the band-pass filter allows $f_r$ to pass and blocks $f_p$ and $f_a$; and, the low-pass filter allows $f_a$ to pass and blocks $f_p$.

The LO filter and its matching network A function to realize the isolation of a local oscillation port LO from a signal input port to prevent signal leakage and ensure the matching of the ports. The band-pass filter and its matching network D function to ensure the matching of the signal input port and reduce the return loss, and filter the input signal to remove useless interference. The low-pass filter and its matching network C function to realize the matching of the port, remove useless matters in the output spectrum and reserve the desired matter.

The operating principle of the passive frequency mixer based on a room-temperature semiconductor maser in this example is shown in FIG. 4. During the operation of the frequency mixer, the heterojunction-containing transistor is excited by the pumped microwaves $f_p$, and the polaritons transition from the initial energy level to an excited-state energy level $E_h$. The frequency can be regarded as the local oscillation frequency of the frequency mixer. At this time, a signal $f_r$ is input to excite the polaritons to transition from the excited-state energy level $E_h$ down to a lower energy level $E_r$ according to the input signal frequency, and a frequency $f_a=f_p-f_r$ is output. Thus, signal frequency mixing is realized.

Figure 5B:
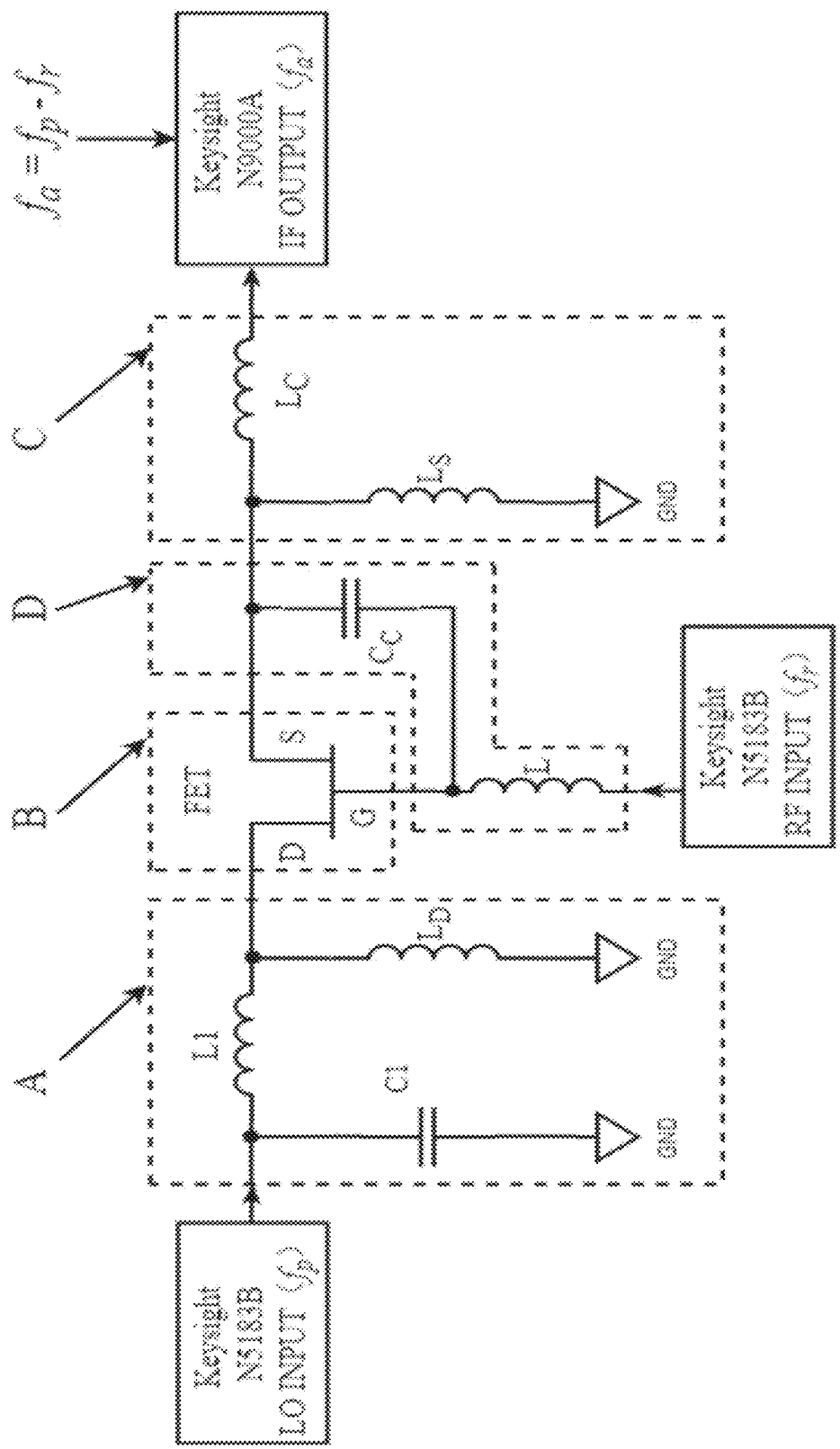

The specific structure diagram of the passive frequency mixer in Example 1 is shown in FIG. 5B. The LO input is generated by a Keysight N5183B signal generator. The LO filter and its matching network A comprise inductors $L_1$ and $L_D$ and a capacitor $C_1$. One end of the inductor $L_1$ is grounded by $C_1$, while the other end thereof is grounded by $L_D$. The signal input is generated by a Keysight N5183B radio-frequency signal generator. The band-pass filter and its matching network D comprise an inductor L and a capacitor $C_C$. The signal input is transmitted to a gate of an FET through the inductor L, and two ends of the capacitor $C_C$ are connected to the gate and source of the FET, respectively. The low-pass filter and its matching network C comprise inductors $L_C$ and $L_S$. One end of the inductor $L_C$ is grounded by $L_S$, while the other end is a signal output end.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata;
$C_C$: Ceramic capacitor, 3.3 pF, GQM1885C2A3R3CB01, muRata;
L and $L_C$: Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
Substrate: RO4350B, thickness: 0.02", Rogers.

Figure 6:
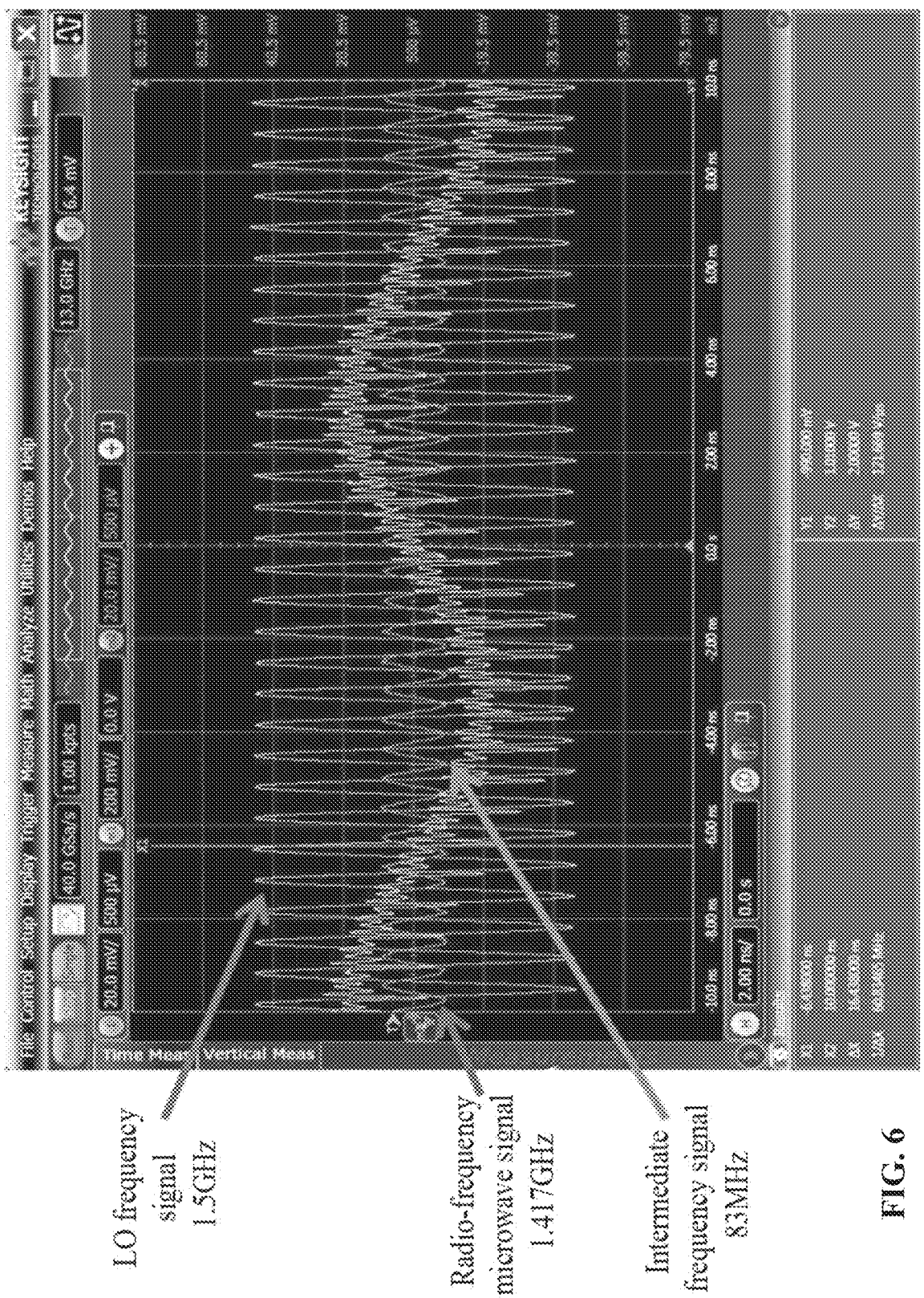
FIG. 6 shows the test result of the passive frequency mixer based on a room-temperature semiconductor maser according to Example 1 of the disclosure.

FIG. 6 shows the test result of the passive frequency mixer based on the room-temperature semiconductor maser according to Example 1. It can be known from FIG. 6 that passive frequency mixing can be realized by the disclosure.

The passive frequency mixer based on the room-temperature semiconductor maser in Example 1 has the advantages simple structure, low LO power, certain frequency conversion gain and the like, and effectively solves the problems such as high frequency conversion loss and high LO power in the conventional passive frequency mixers. Moreover, the obtained frequency mixer has a certain gain, and can be widely applied in fields such as communication, sensing, quantum technology and electronics.

Example 2

This example provides a radio-frequency microwave oscillator based on the room-temperature semiconductor maser according to the disclosure. The structure of the radio-frequency microwave oscillator is the same as the structure of the semiconductor maser (as shown in FIG. 3). The operating principle will be described below. The frequency $f_p$ of the input pumped microwaves is used as a bias signal, and the power of the fed pumped microwaves is used as a control signal. By using the feedback provided by the resonant network at its resonant frequency, the polaritons, excited to a higher energy level by the pumped microwaves, in the heterojunction-containing transistor firstly transition to a specified energy level in an energy level region and then transition to a ground-state energy level, so as to realize stable oscillation output.

Figure 7:
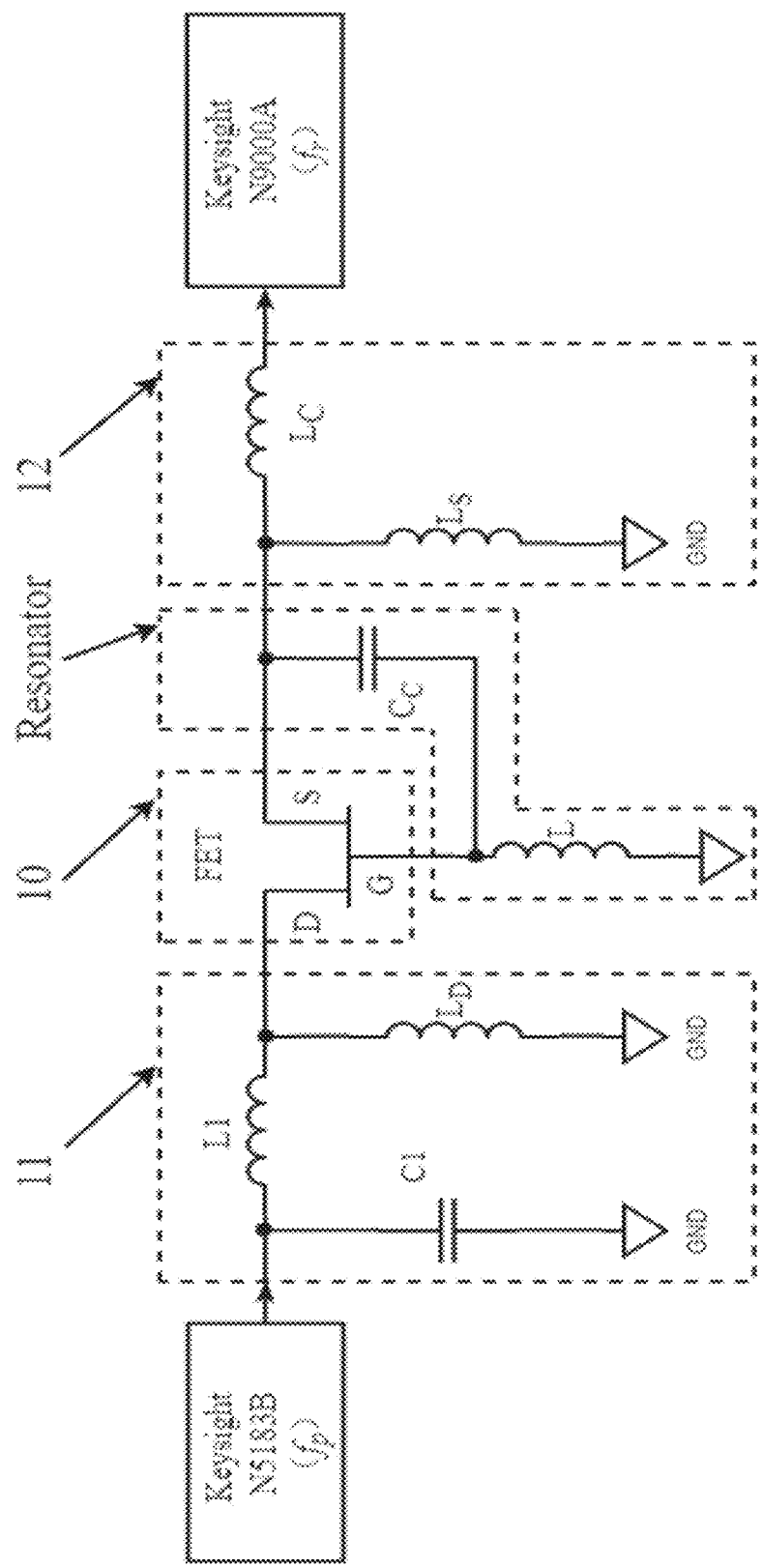
FIG. 7 is a structure diagram of a radio-frequency microwave oscillator based on a room-temperature semiconductor maser according to Example 2 of the disclosure.

The structure diagram of the radio-frequency microwave oscillator based on the room-temperature semiconductor maser in Example 2 is shown in FIG. 7. The first matching network 11 comprises inductors $L_1$ and $L_D$ and a capacitor $C_1$. One end of the inductor $L_1$ is grounded by $C_1$, while the other end thereof is grounded by $L_D$. The second matching network 12 comprises inductors $L_C$ and $L_S$. One end of the inductor $L_C$ is grounded by $L_S$, while the other end thereof is a signal output end. The resonant network comprises an inductor L and a capacitor $C_C$. The gate of the FET is grounded by the inductor L, and two ends of the capacitor $C_C$ are connected to the gate and source of the FET, respectively.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata
$C_C$: Ceramic capacitor, 510 pF, GQM2195C2A511JB12, muRata;
L and $L_C$; Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
Substrate: RO4350B, thickness: 0.02", Rogers.

Figure 8:
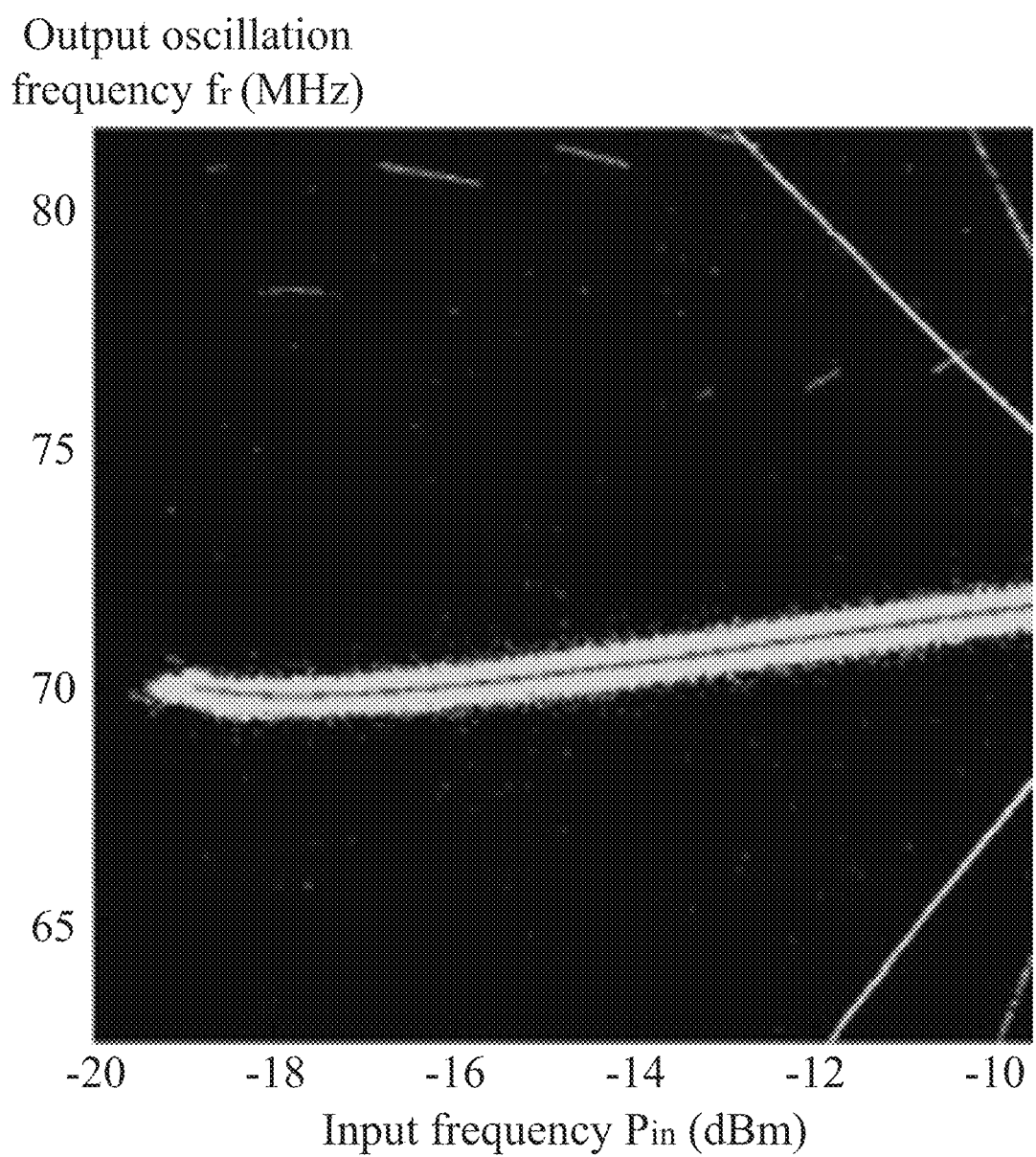
FIG. 8 shows the relationship between the input power and the output oscillation frequency $f_r$ of the radio-frequency microwave oscillator based on a room-temperature semiconductor maser according to Example 2 of the disclosure when the input frequency is 578.65 MHz.

FIG. 8 shows the relationship between the input power and the output oscillation frequency $f_r$ of the radio-frequency microwave oscillator based on a room-temperature semiconductor maser according to Example 2 when the input frequency is 578.65 MHz. It indicates that the output oscillation frequency $f_r$ can be changed by changing the power of the fed pumped microwaves when the pumping frequency is determined to be 578.65 MHz.

The radio-frequency microwave oscillator in this example is simple in structure and easy to use, can operate without a DC bias and a control voltage as long as the pumped microwaves are received by an external antenna or a transmission line, and can be widely applied in fields such as medicine, security, sensing, quantum technology and electronics.

Example 3

This example provides a frequency stabilization method based on a room-temperature semiconductor maser. Polaritons in a heterojunction-containing transistor are excited to a higher energy level by pumped microwaves $f_p$ received by a transmission line or an external antenna, and a resonant network provides a specified energy path at its resonant frequency, so that the polaritons excited to the higher energy level transition to a specified energy level in the energy level region so as to realize stable oscillation output.

Figure 9:
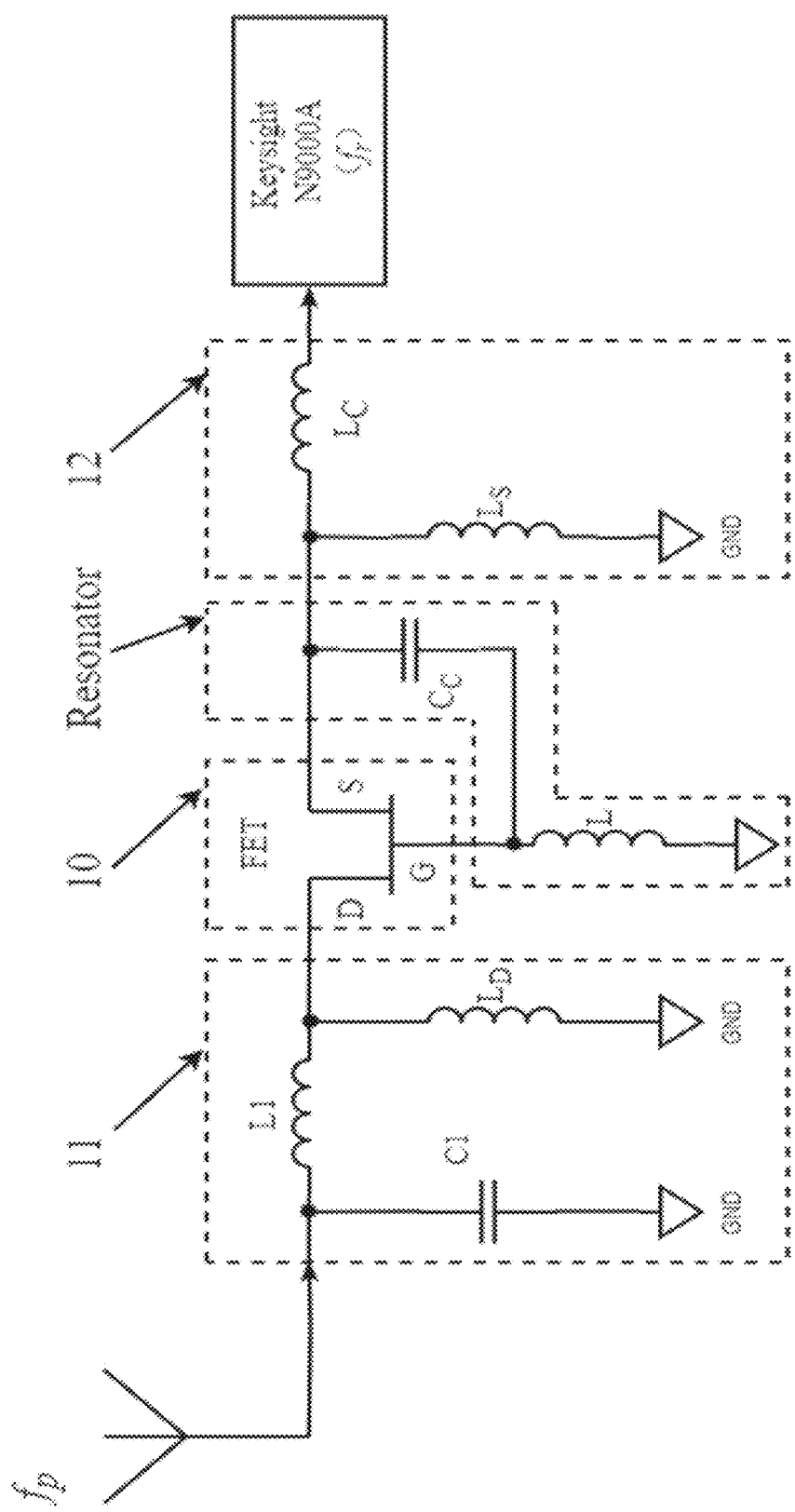
FIG. 9 is a structure diagram of a semiconductor maser in a frequency stabilization method based on a room-temperature semiconductor maser according to Example 3.

The structure diagram of the semiconductor maser in the frequency stabilization method based on a room-temperature semiconductor maser in Example 3 is shown in FIG. 9. The first matching network 11 comprises inductors $L_1$ and $L_D$ and a capacitor $C_1$. One end of the inductor $L_1$ is grounded by $C_1$, while the other end thereof is grounded by $L_D$. The second matching network 12 comprises inductors $L_C$ and $L_S$. One end of the inductor $L_C$ is grounded by $L_S$, while the other end thereof is a signal output end. The resonant network comprises an inductor L and a capacitor $C_C$. The gate of the FET is grounded by the inductor L, and two ends of the capacitor $C_C$ are connected to the gate and source of the FET, respectively.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata;
$C_C$: Ceramic capacitor, 510 pF, GQM2195C2A511JB12, muRata;
L and $L_C$; Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
Substrate: RO4350B, thickness: 0.02", Rogers.

Figure 10:
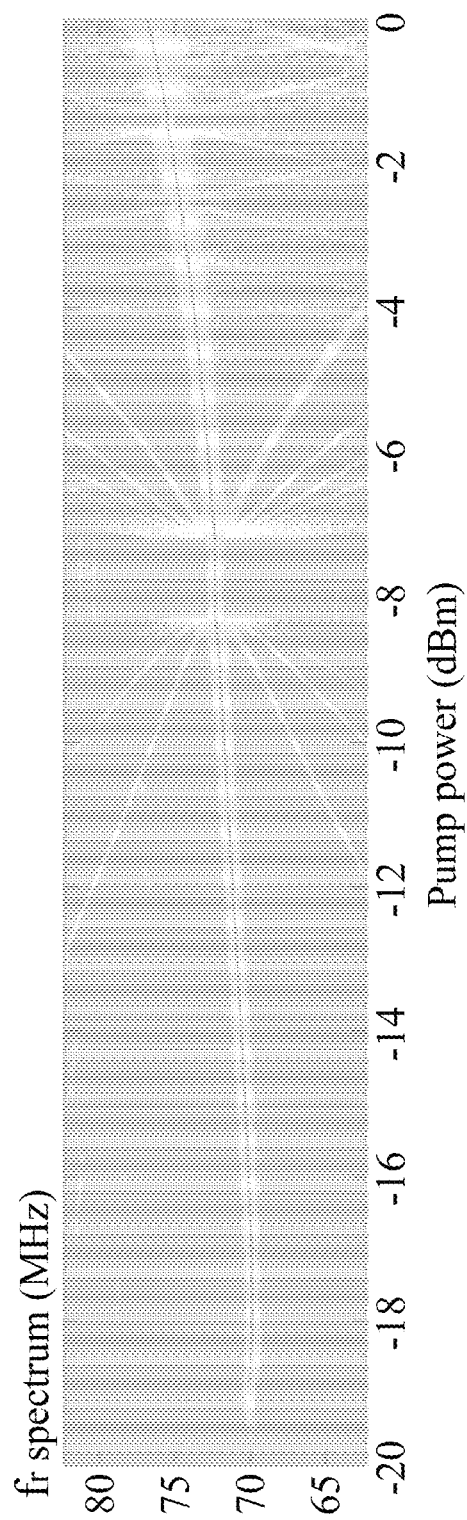
FIG. 10 is a curve of the change in $f_r$ spectral density of a heterojunction-containing transistor with the $f_p$ power, in the frequency stabilization method based on a room-temperature semiconductor maser according to Example 3 of the disclosure.

FIG. 10 is a curve of the change in $f_r$ spectral density of the heterojunction-containing transistor with the $f_p$ power in the frequency stabilization method based on a room-temperature semiconductor maser according to Example 3 of the disclosure. When the frequency of the input pumped microwaves $f_p$ is fixed and the input power $p_{in}$ is changed, self-locking will occur. That is, when the input power reaches a certain range (a stable frequency range), with the increase of the input power, the frequency of the output signal $f_r$ will be locked. In accordance with this phenomenon, stable oscillation output can be obtained by feeding pumped microwaves having a power that is a constant value in the stable frequency range.

Example 4

Figure 11:
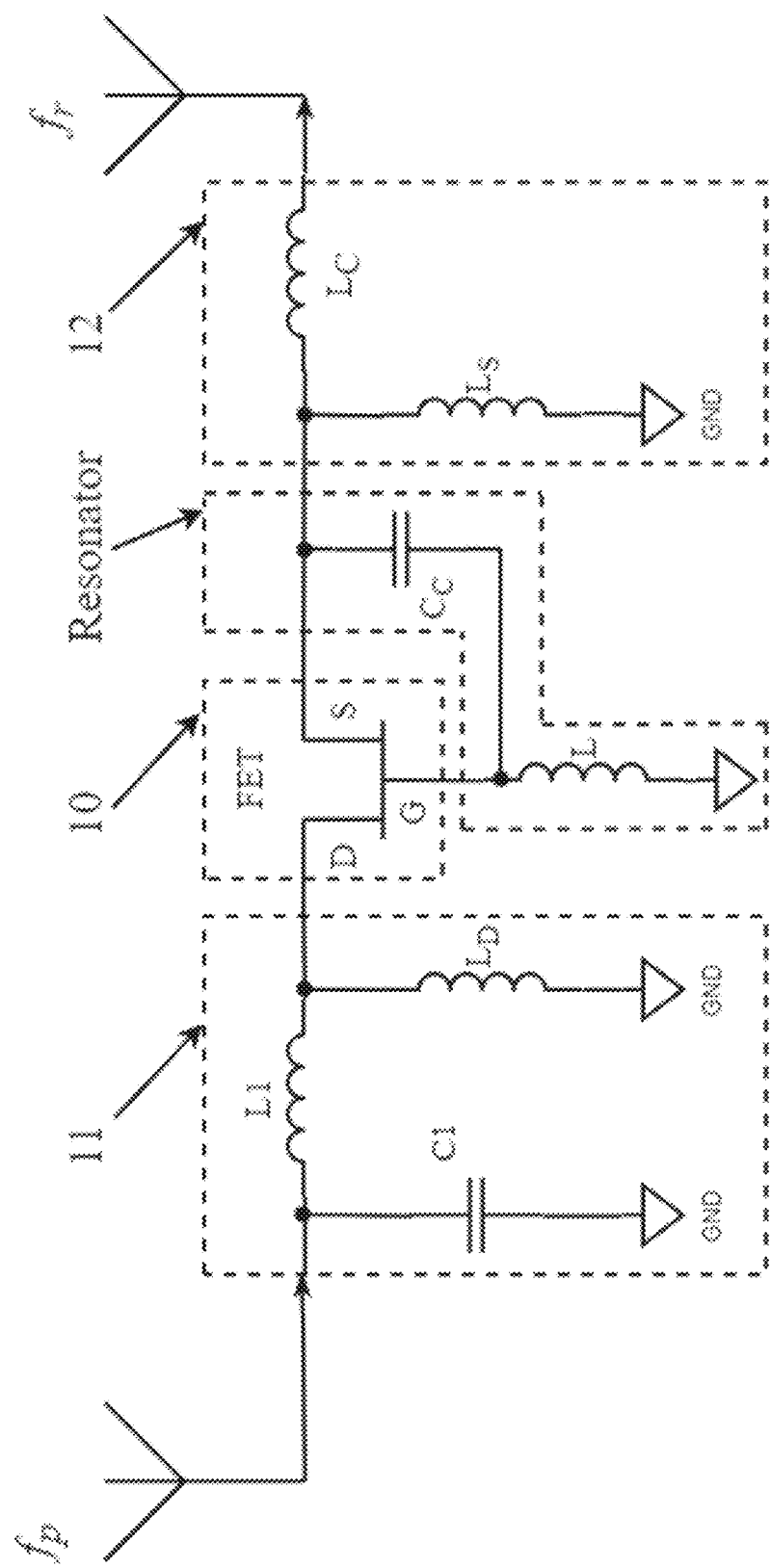
FIG. 11 is a structure diagram of a semiconductor maser in the clock distribution based on a room-temperature semiconductor maser according to Example 4 of the disclosure.

FIG. 11 is a structure diagram of the semiconductor maser in the clock distribution based on a room-temperature semiconductor maser according to Example 4 of the disclosure. The first matching network 11 comprises inductors $L_1$ and $L_D$ and a capacitor $C_1$. One end of the inductor $L_1$ is grounded by $C_1$, while the other end thereof is grounded by $L_D$. The second matching network 12 comprises inductors $L_C$ and $L_S$. One end of the inductor $L_C$ is grounded by $L_S$, while the other end thereof is a signal output end. The resonant network comprises an inductor L and a capacitor $C_C$. The gate of the FET is grounded by the inductor L, and two ends of the capacitor $C_C$ are connected to the gate and source of the FET, respectively.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata;
$C_C$: Ceramic capacitor, 510 pF, GQM2195C2A511JB12, muRata;
L and $L_C$; Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
Substrate: RO4350B, thickness: 0.02", Rogers.

In the clock distribution method based on a room-temperature semiconductor maser in this example, a pumped microwave signal having a frequency of 578.65 MHz is input, the input power Pin is changed, and the change in frequency of the output signal is recorded, so that a change curve shown in FIG. 10 is obtained. When the frequency of the input pumped microwaves $f_p$ is fixed and the input power $p_{in}$ is changed, self-locking will occur. That is, when the input power reaches a certain range (a stable frequency range), with the increase of the input power, the frequency of the output signal $f_r$ will be locked. In accordance with this phenomenon, stable clock output can be generated by feeding, by a receiving antenna or a transmission line, pumped microwaves having a power that is a constant value in the stable frequency range. The stable clock signal can be transmitted by a transmitting antenna and then received by a corresponding receiver. In this way, wireless clock distribution can be realized. It can be known from FIG. 10 that, when the input power Pin is −8.3 dBm to −7.3 dBm, the frequency of the output signal is kept at about 72 MHz, that is, self-locking occurs.

Figure 12:
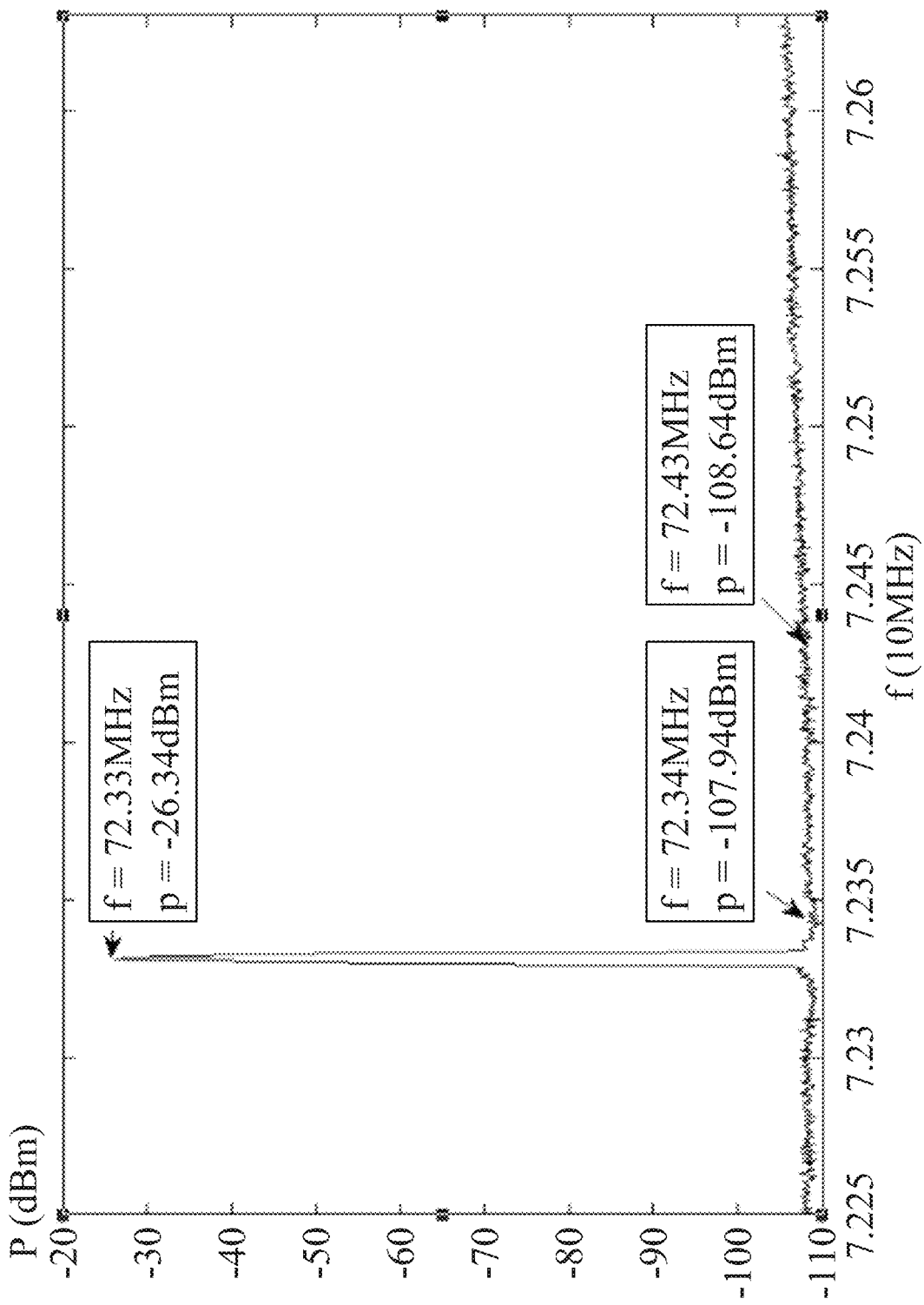
FIG. 12 is a graph of the output phase noise in the clock distribution based on a room-temperature semiconductor maser according to Example 4 of the disclosure.

The stability of the output signal during self-locking will be detected below. Pumped microwaves having a frequency $f_p$ of 578.65 MHz and a power Pin of −7.82 dBm are fed into a high electron mobility transistor through the first matching network, the inductances and capacitances of the input and output matching networks are adjusted, and the impedance of the drain and source of the transistor is matched to 50Ω, so that the input resonance point $f_t=f_p$ is matched to 578.65 GHz and the output resonance point $f_r$ is matched to 72 MHz. The phase noise in the signal at the front end of the transmitting antenna is tested, and the result is shown in FIG. 12. It can be known from FIG. 12 that the operating frequency is 72.33 MHz; when the frequency shift is 100 kHz, the phase noise is −113.1 dBc/Hz; when the frequency shift is 10 kHz, the phase noise is −112.4 dBc/Hz; and, when the frequency shift is 1 kHz, the phase noise is −98.7 dBc/Hz. It can be known from the test result that, during the self-locking, the index of the output phase noise is remarkable, and the frequency stabilization performance is excellent.

Figure 13:
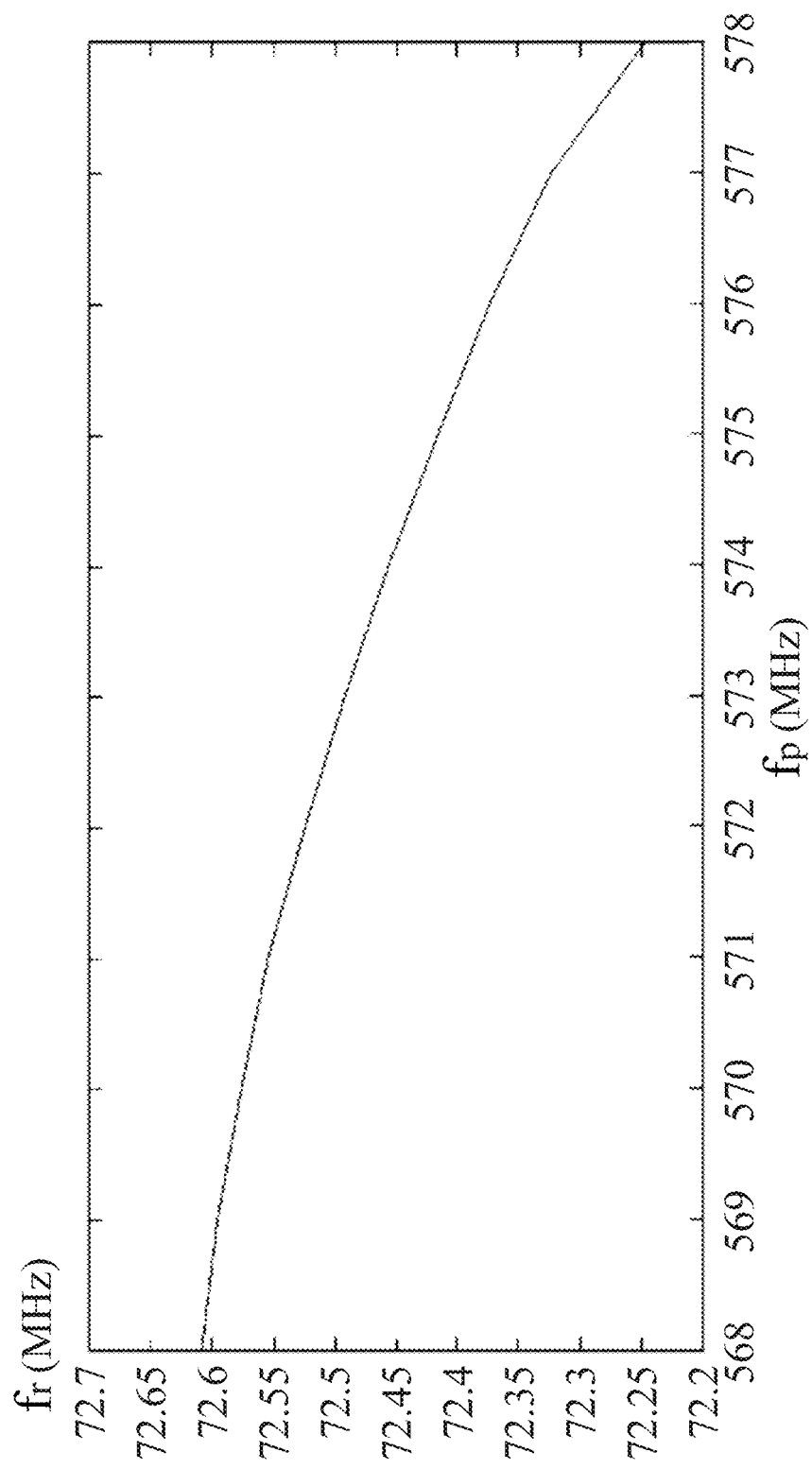
FIG. 13 shows the relationship between the frequency $f_p$ of the input pumped microwaves and the frequency $f_r$ of the output signal, in the clock distribution based on a room-temperature semiconductor maser according to Example 4 of the disclosure.

By determining the power of the fed pumped microwaves Pin to be −7.82 dBm and changing the frequency $f_p$ of the input signal, the frequency value of the output signal $f_r$ is tested, and the result is shown in FIG. 13. It can be found from the test that, when the power of the fed pumped microwaves is a definite value, the frequency of the output oscillation signal $f_r$ can be controlled by the frequency of the pumped microwaves $f_p$, so that the clock signal can be tuned.

Example 5

Figure 14A:
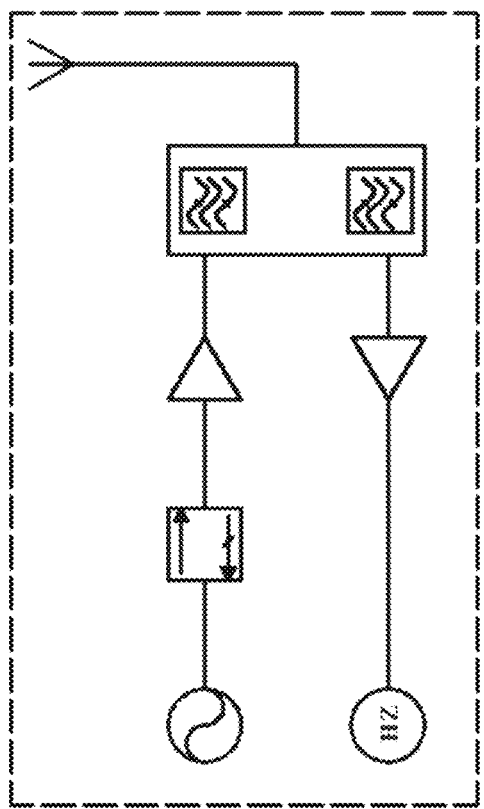
FIGS. 14A-14B are schematic views of an overall structure of a microwave ranging system based on passive frequency conversion according to Example 5 of the disclosure.
Figure 14B:
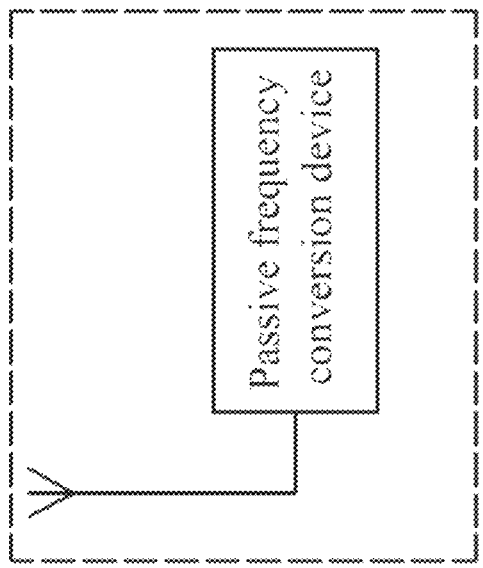

FIGS. 14A-14B are schematic views of an overall structure of a microwave ranging system based on passive frequency conversion according to the disclosure, the microwave ranging system comprising two parts, i.e., a master station instrument and a slave station instrument. The frequency of the microwave signal generated by a signal source 1 in the master station instrument in the disclosure is 3 MHz to 40 GHz. For convenience of description, the following description will be given by taking a single-tone signal having a frequency of 2.5 GHz as an example.

Figure 15A:
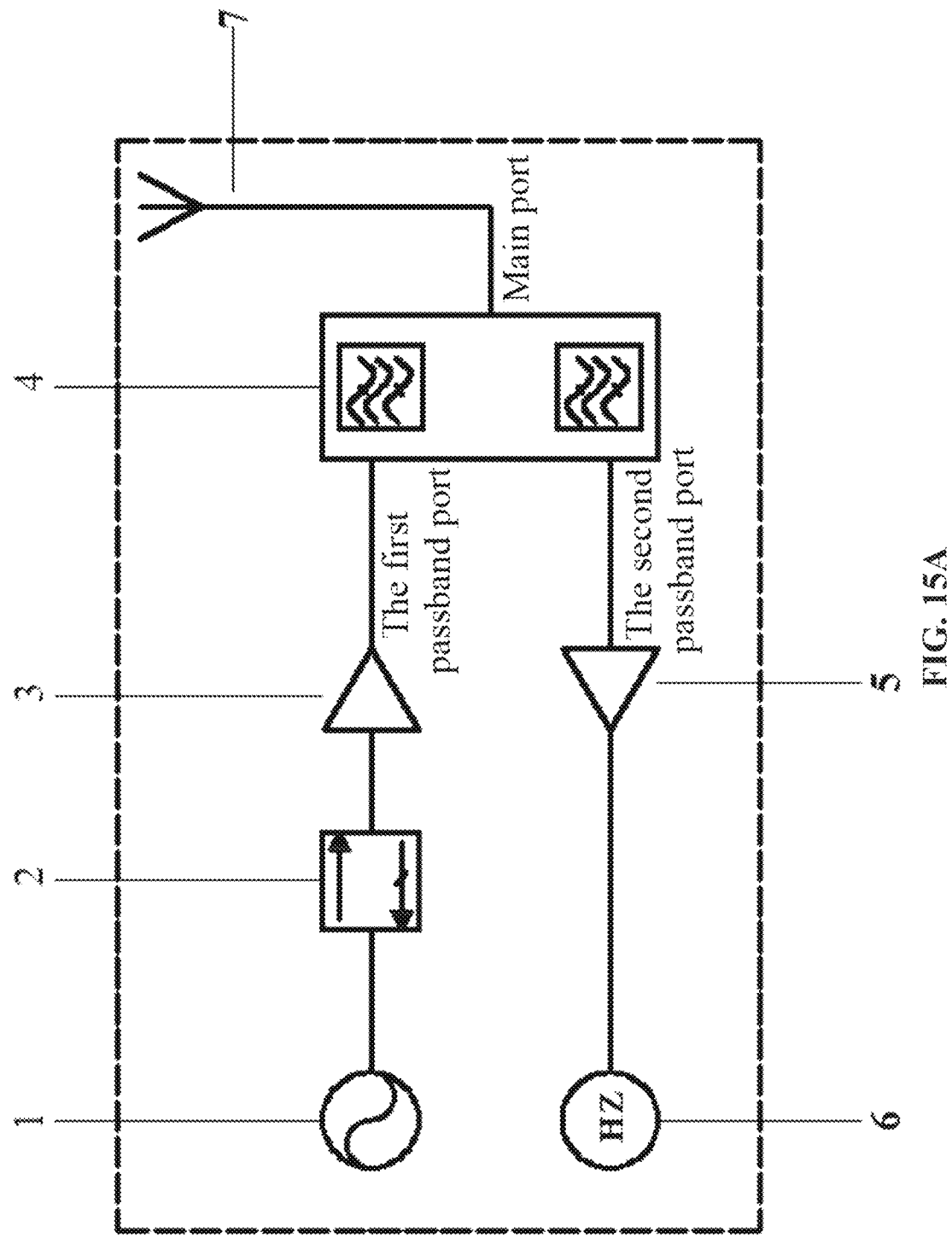
FIG. 15A is a structure diagram of a master station instrument in the microwave ranging system based on passive frequency conversion according to the disclosure and FIG. 15B is a structure diagram of the maser station instrument in Example 5, in which: 1: signal source; 2: isolator; 3: power amplifier; 4: duplexer; 5: low-noise filter; 6: frequency detector; and, 7: maser station instrument antenna.
Figure 15B:
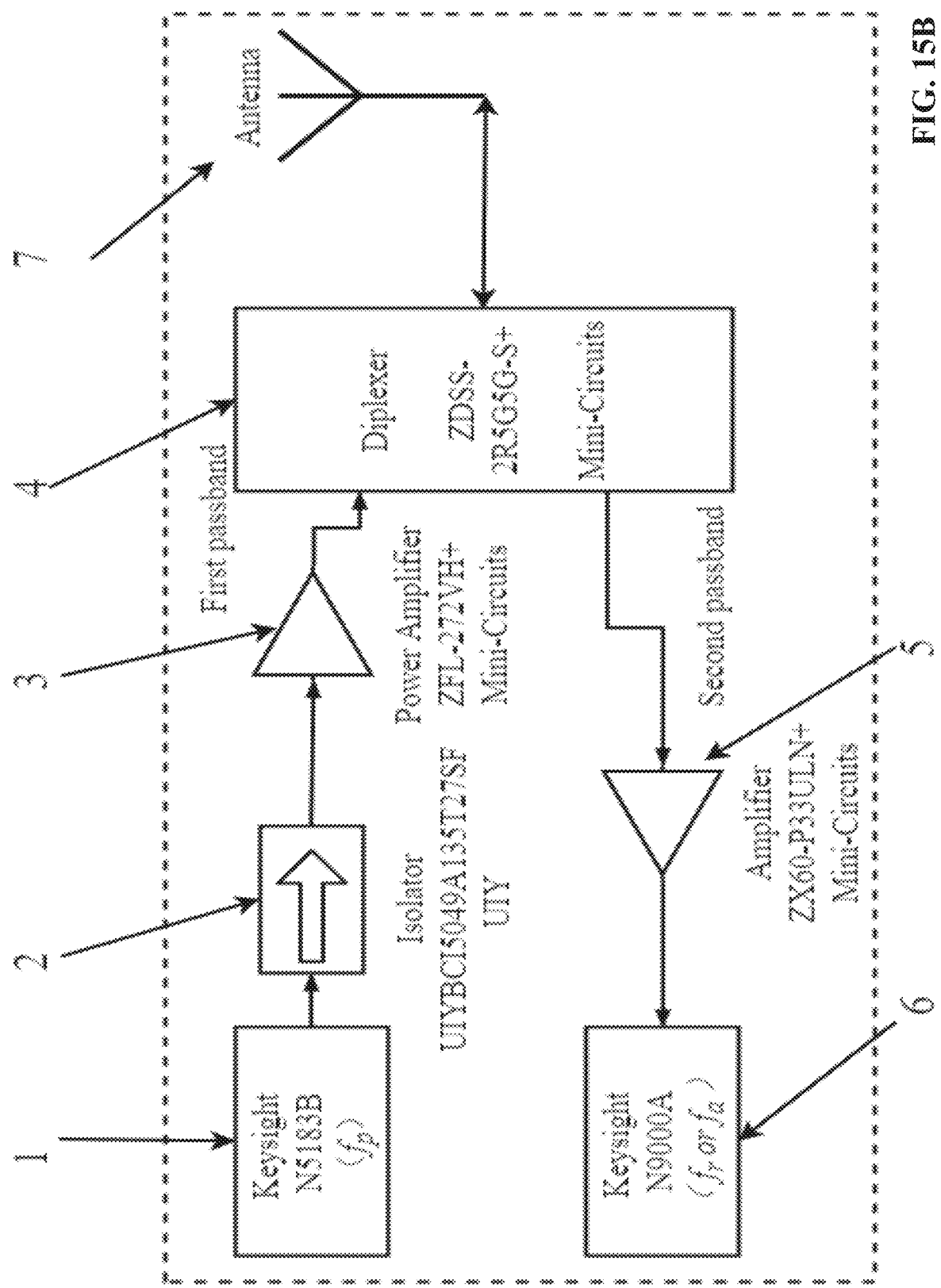

FIG. 15A is a structure diagram of the master station instrument. The master station instrument comprises a signal source 1, an isolator 2, a power amplifier 3, a duplexer 4, a low-noise amplifier 5, a frequency detector 6 and a master station instrument antenna 7. The signal source 1 functions to generate a radio-frequency single-tone signal having a frequency of 2.5 GHz. The isolator 2 is arranged behind the signal source 1 to prevent the reflected signal from returning to the signal source to damage the signal source 1. The power amplifier 3 is arranged behind the isolator 1 to amplify the single-tone signal having a frequency of 2.5 GHz, to ensure that the signal satisfies the threshold power required by passive frequency conversion after it is attenuated. An output end of the power amplifier is connected to a 2.5 GHz passband port (i.e., first passband port) of the duplexer 4, and a main port of the duplexer 4 is connected to the master station instrument antenna 7. The frequency range of the second passband of the duplexer 1 should be greater than or equal to the frequency range of the output signal $f_2$ of the passive frequency conversion device (2.416 GHz<$f_2$<2.428 GHz in this example), and the isolation of the first passband from the second passband should be enough to prevent large signals at 2.5 GHz from leaking to a channel used for receiving the signal $f_2$. The second passband port is connected to the input end of the low-noise amplifier 5 to amplify the passive frequency conversion signal $f_2$ from the slave station instrument so as to facilitate frequency detection. The frequency detector 6 is connected to an output port of the low-noise amplifier 5 to detect the frequency of the frequency conversion signal $f_2$. The specific structure of the master station instrument in this example is shown in FIG. 15B.

Figure 16A:
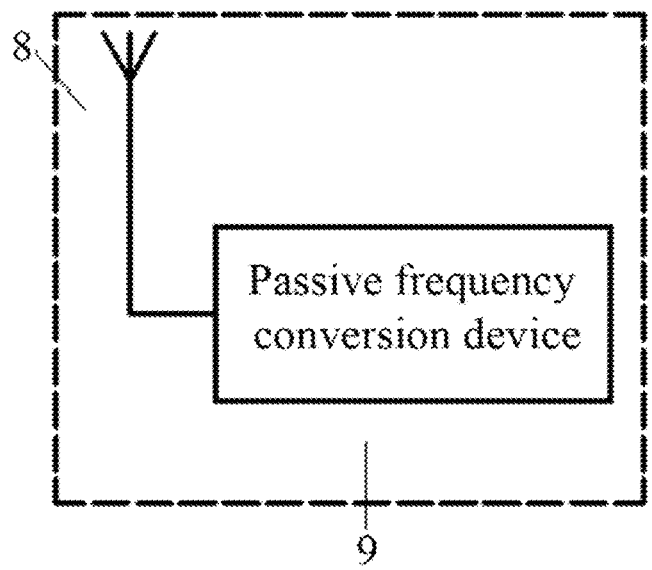
FIG. 16A is a structure diagram of a slave station instrument in the microwave ranging system based on passive frequency conversion according to the disclosure and FIG. 16B is a structure diagram of the slave station instrument in Example 5, in which: 8: slave station instrument antenna; and, 9: passive frequency conversion device.
Figure 16B:
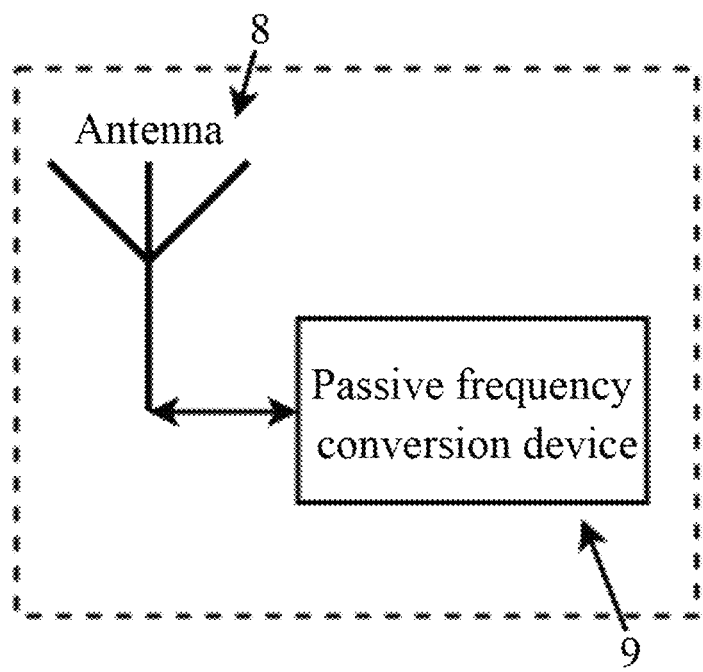

FIG. 16A is a structure diagram of the slave station instrument. The slave station instrument comprises a slave station instrument antenna 8 and a passive frequency conversion device 9. The slave station instrument antenna 8 receives a signal having a frequency of 2.5 GHz from the master station instrument (the signal is a power signal required for the frequency conversion performed by the passive frequency conversion device 9), and transmits a frequency conversion signal $f_2$ generated by the passive frequency conversion device 9.

Figure 17A:
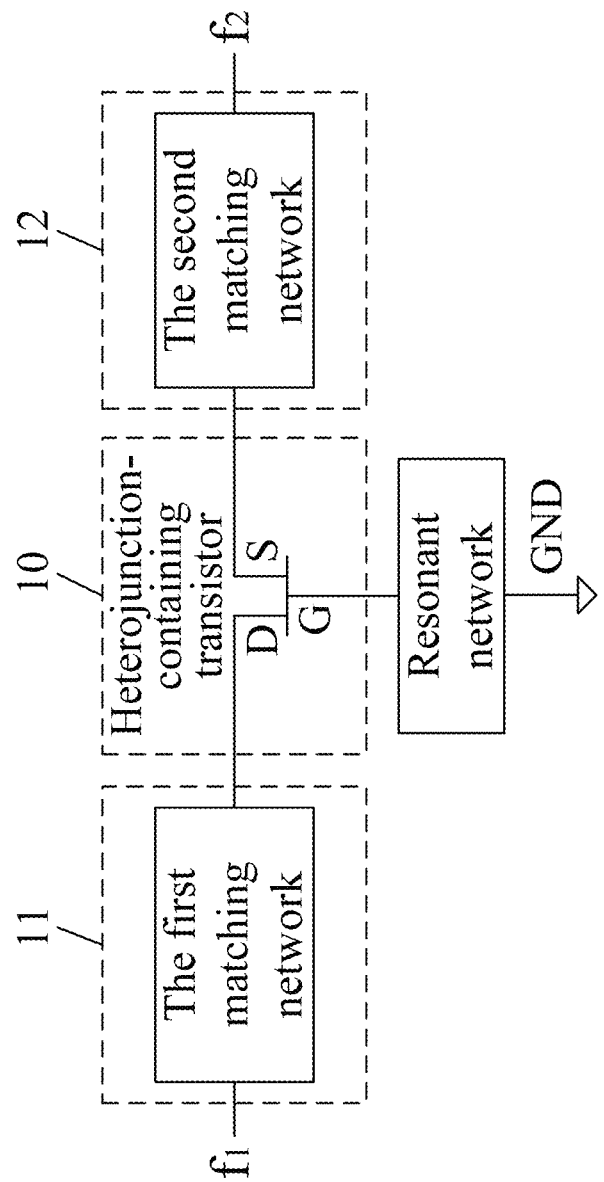
FIG. 17A is a structure diagram of a passive frequency conversion device in the microwave ranging system based on passive frequency conversion according to the disclosure and FIG. 17B is a structure diagram of the passive frequency conversion device in Example 5, in which: 10: heterojunction-containing transistor; 11: first matching network; and, 12: second matching network.

FIG. 17A is a structure diagram of the passive frequency conversion device 9. The passive frequency conversion device 9 comprises a heterojunction-containing transistor 10. The heterojunction-containing transistor can convert a low-power radio-frequency single-tone signal (having a frequency of $f_1$) into a frequency-irrelevant single-tone signal (having a frequency of $f_2$) without supplying any DC, where $f_2$ is controllable. This is a passive frequency conversion technology. During the operation, pumped microwaves (which are single-tone signals having a frequency of $f_1$ in this example) are input into the drain, and the polaritons in the ground-state energy level $E_0$ are excited to a higher energy level $E_h=E_0+h·f_1$ (where h is the Planck constant, and $f_1$ is the input frequency). Spontaneous radiation occurs when the instable polaritons in the energy level $E_h$ transition to a lower energy level. To realize stable excited radiation, a specified energy level is provided by a resonant network (a resonant network formed by the resonant inductance and the junction capacitance inside the heterojunction-containing transistor) at its resonant frequency $f_r$. Thus, the excited polaritons will have the maximum transition rate in the energy level:

$$E_r=E_h-h·f_r=E_0+h·(f_1-f_r)$$

Therefore, the polaritons firstly transition from $E_h$ to $E_r$ to generate a frequency $f_2=f_1-f_r$ by radiation, and then transition from $E_r$ to $E_0$ to generate a frequency $f_r$ by radiation. $f_2$ is controlled by $f_1$ and the level power thereof. Since the energy level has a certain width, the generated frequency $f_2$ has a certain range of variation.

Figure 17B:
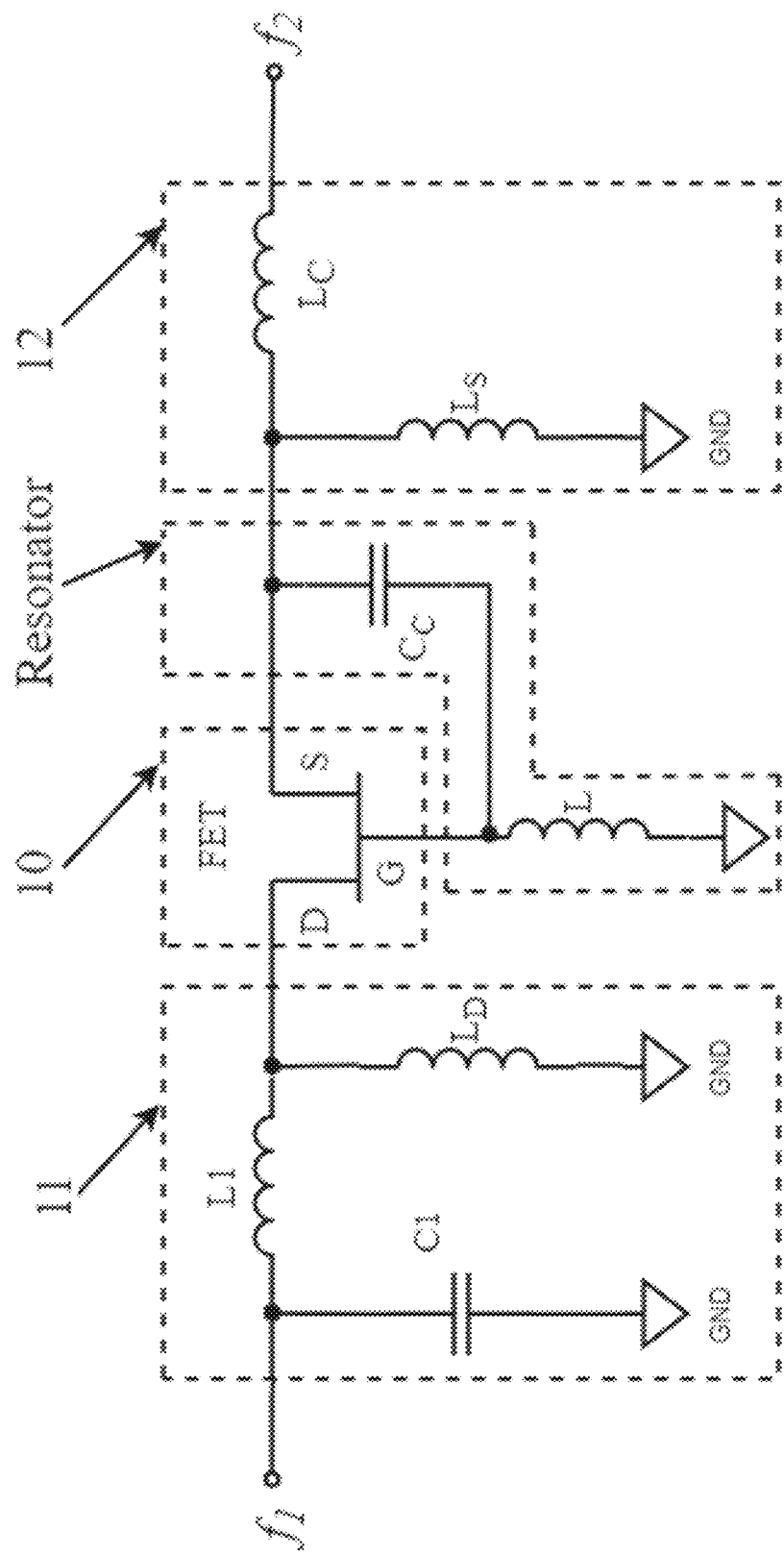

In this example, the specific structure diagram of the passive frequency conversion device is shown in FIG. 17B. The first matching network 11 comprises inductors $L_1$ and $L_D$ and a capacitor $C_1$. One end of the inductor $L_1$ is grounded by $C_1$, while the other end thereof is grounded by $L_D$. The second matching network 12 comprises inductors $L_C$ and $L_S$. One end of the inductor $L_C$ is grounded by $L_S$, while the other end thereof is a signal output end. The resonant network comprises an inductor L and a capacitor $C_C$. The gate of the FET is grounded by the inductor L, and two ends of the capacitor $C_C$ are connected to the gate and source of the FET, respectively.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata;
$C_C$: Ceramic capacitor, 510 pF, GQM2195C2A511JB12, muRata;
L: Inductor, 680 nH, 1008CS-681X_E, Coilcraft;
$L_C$: Inductor, 100 nH, 1008CS-101X_E, Coilcraft;
$L_1$: Inductor, 68 nH, 1008CS-680X_E, Coilcraft;
$L_D$: Inductor, 150 nH, 1008CS-151X_E, Coilcraft;
Substrate: RO4350B, thickness: 0.02", Rogers.

In this example, the resonant frequency $f_r$ is 80 MHz, and based on it, the frequency $f_2$ of the output frequency conversion signal is determined. The frequency of the output frequency conversion signal changes near:

$$f_2=f_1-f_r=2.5\text{ GHz}-80\text{ GHz}=2.42\text{ GHz}$$

The power of the signal $f_1$ transmitted by the master station instrument antenna is attenuated by the maximum measurement distance and then received by the slave station instrument, and is still higher than the threshold power at which the passive frequency conversion can occur. The transmitted power is mainly ensured by the power amplifier in the master station instrument.

In two passbands of the duplexer of the master station instrument, one passband transmits the single-tone signal $f_1$, and the bandwidth of the other passband should satisfy the frequency range of the passive frequency conversion signal $f_2$. Meanwhile, the isolation of the two passbands should be high enough.

In a case where the master station instrument antenna and the slave station instrument antenna are aligned in the polarization direction and the maximum receiving direction, the sensitivity is highest, and the measured distance is longest. When the master station instrument antenna and the slave station instrument antenna are not aligned in the polarization direction and the maximum receiving direction, the measurement still can be carried out, with lower measurement sensitivity and shorter acting distance.

Figure 18:
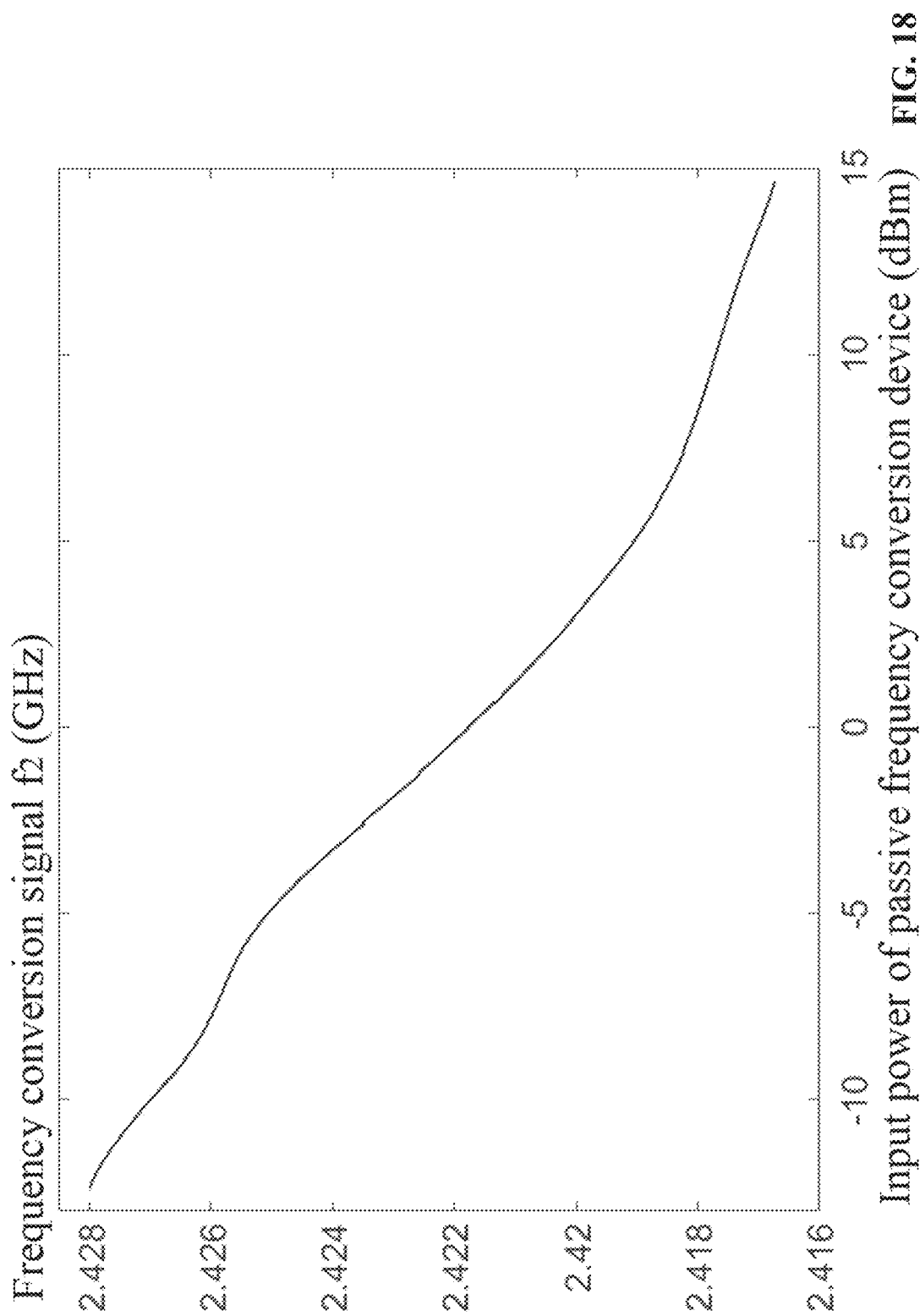
FIG. 18 is a schematic view of the relationship between the received power of the passive frequency conversion device and the frequency of the output frequency conversion signal according to Example 5.
Figure 19:
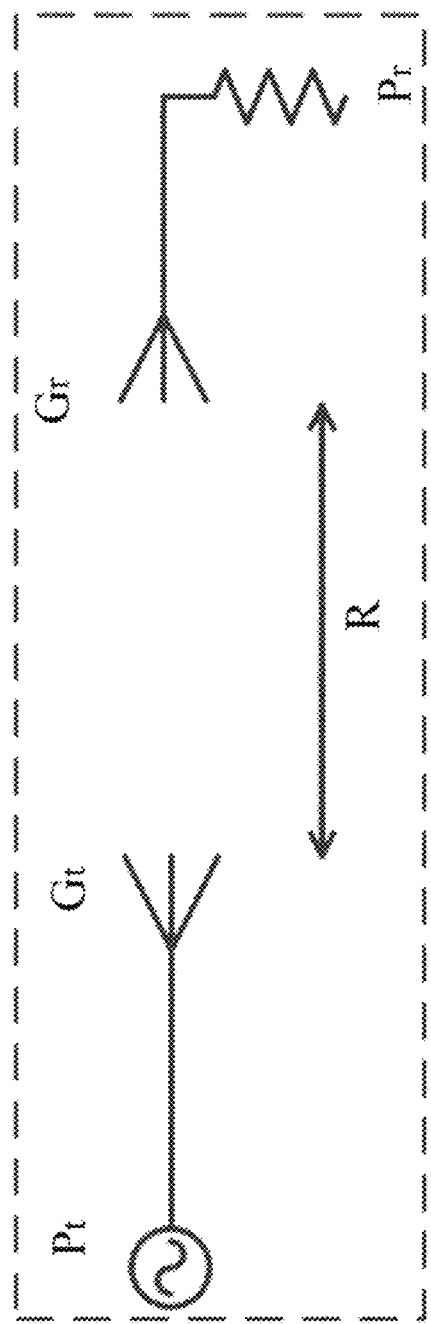
FIG. 19 is a schematic view of the definition of parameters of the Friis formula used in Example 5.

When microwave ranging is performed by using this system, in a specific embodiment of the disclosure, the relationship between the power of the 2.5 GHz signal received by the passive frequency conversion device and the frequency $f_2$ of the output frequency conversion signal is shown in FIG. 18. It can be known from FIG. 18 that there is a one-to-one mapping relationship between the power of the 2.5 GHz signal received by the passive frequency conversion device and the output frequency conversion signal $f_2$. The frequency detector 6 of the master station instrument detects the frequency of the frequency conversion signal $f_2$, and the power of the 2.5 GHz signal received by the passive frequency conversion device 9 can be determined by using the data relation in FIG. 8, denoted by Pr. Meanwhile, the power Pt of the 2.5 GHz signal from the transmitting end of the master station instrument is calculated by using the linkage relation. The specific calculation process is shown in FIG. 19, which is a schematic view of the parameters in the Friis formula. Now, the power at two ends of the transceiving antenna has been known. Then, the distance between the master and slave station instruments can be calculated by the Friis formula.

The ranging system in Example 5 of the disclosure is based on the passive frequency conversion technology. A low-power radio-frequency single-tone signal (having a frequency of $f_1$) is converted into a frequency-irrelevant single-tone signal (having a frequency of $f_2$), where $f_2$ is controllable. The distance between the master and slave station instruments can be calculated by using the Friis transmission formula and the power-frequency curve of the passive frequency conversion device. The ranging system has the following advantages.

1. The slave station instrument in the ranging system is simple in structure, and does not require any complicated transmitting system.

2. Unlike three existing ranging methods (i.e., the pulse method, the frequency method and the phase method), a new method is provided for microwave ranging.

3. The cost of the ranging system is reduced, the size and weight of the slave station instrument are decreased, and the range of application is expanded.

Example 6

This example provides a wireless DC-free sensing information transmission circuit. Pumped microwaves are received by a transceiving antenna, polaritons in a heterojunction-containing transistor are excited to a higher energy level, and the polaritons excited to the higher energy level transition to a specified energy level according to the feedback of the resonant network to generate a microwave signal corresponding to the resonant frequency of the resonant network. This signal is modulated by the information from sensor, and the signal modulated by the information is finally transmitted by the transceiving antenna. There is a linear correspondence between the modulated microwave signal and the output voltage of the sensor, so the wireless DC-free transmission of the sensing information is realized. The output voltage of the sensor connected in parallel between a drain matching circuit and the heterojunction-containing transistor will change the junction capacitance inside the transistor to control the resonant frequency of the resonant network, so as to form a frequency-modulated signal carrying the sensing information. If it is assumed that the frequency of the fed pumped microwaves is $f_p$ and the resonant frequency of the resonant network is $f_r$, the main frequency of the signal output from the sensing information transmission circuit is also $f_r$ which is modulated by the sensing information. When the voltage U output by the sensor increases, the junction capacitance of the resonant network decreases, so that the resonant frequency increases. It indicates that there is a positively linear relationship between the frequency $f_r$ ($f_r$ is the main frequency of the modulated signal) of the signal, which is output by the circuit and modulated by the sensing information, and the output voltage U of the sensor.

In the wireless DC-free sensing information transmission circuit in this example, after the pumped microwaves are input, the polaritons in the ground-state energy level $E_0$ in the heterojunction-containing transistor are excited to a higher energy level $E_h=E_c+h\cdot f_p$ (where h is the Planck constant and $f_p$ is the pumping frequency). The microwave energy is radiated when the instable polaritons in the energy level $E_h$ transition to a specified energy level. The specified energy level is determined by the resonant frequency $f_r$ of the resonant network to realize a fixed energy path. The resonant frequency $f_r$ is controlled by the output voltage of the sensor. Thus, the excited polaritons transition from $E_h$ to $E_r$ to generate a signal frequency $f_a$ by radiation, where $f_a=f_p-f_r$. There is a linear correspondence between the signal frequency and the output voltage of the sensor. Both the signals having frequencies of $f_a$ and $f_r$ carry the modulated signal, and are finally transmitted from pumped microwave input port while carrying the sensing information.

Figure 20A:
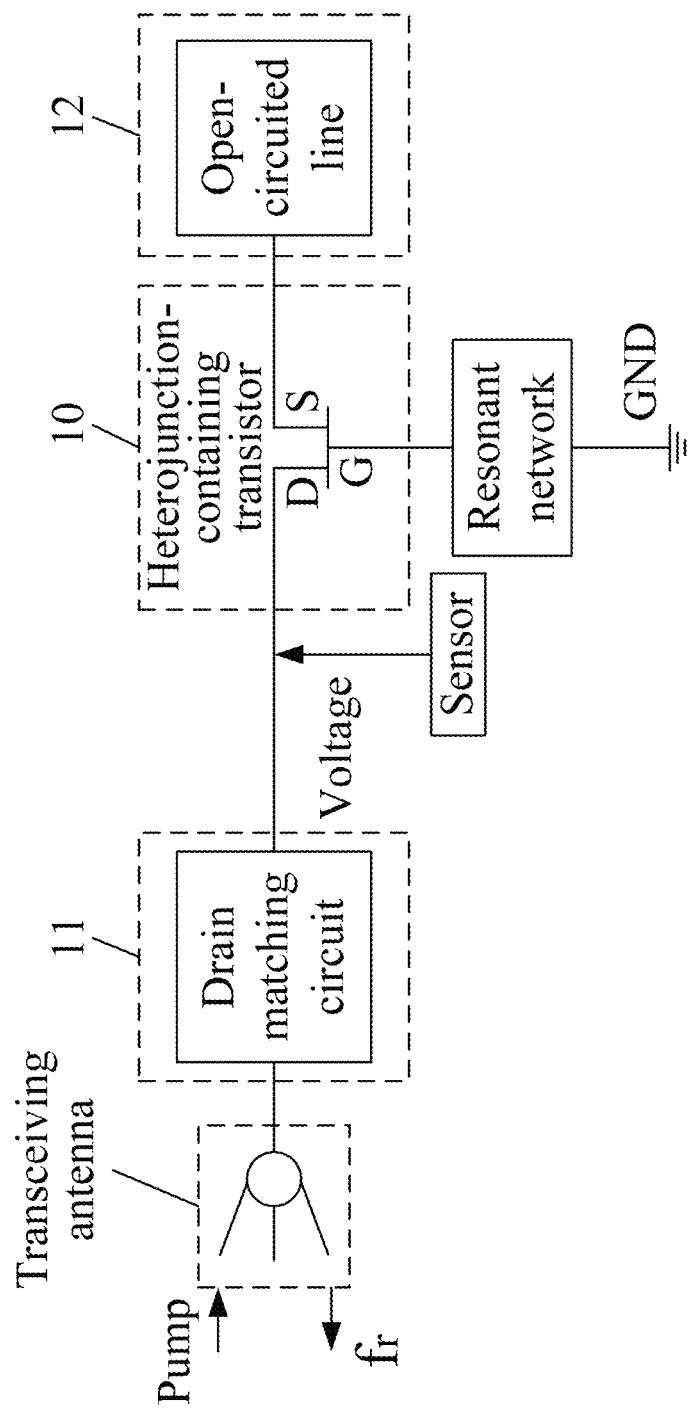
FIG. 20A is a structure diagram of a wireless DC-free sensing information transmission circuit and FIG. 20B is a structure diagram of an information sensing circuit in Example 6.
Figure 20B:
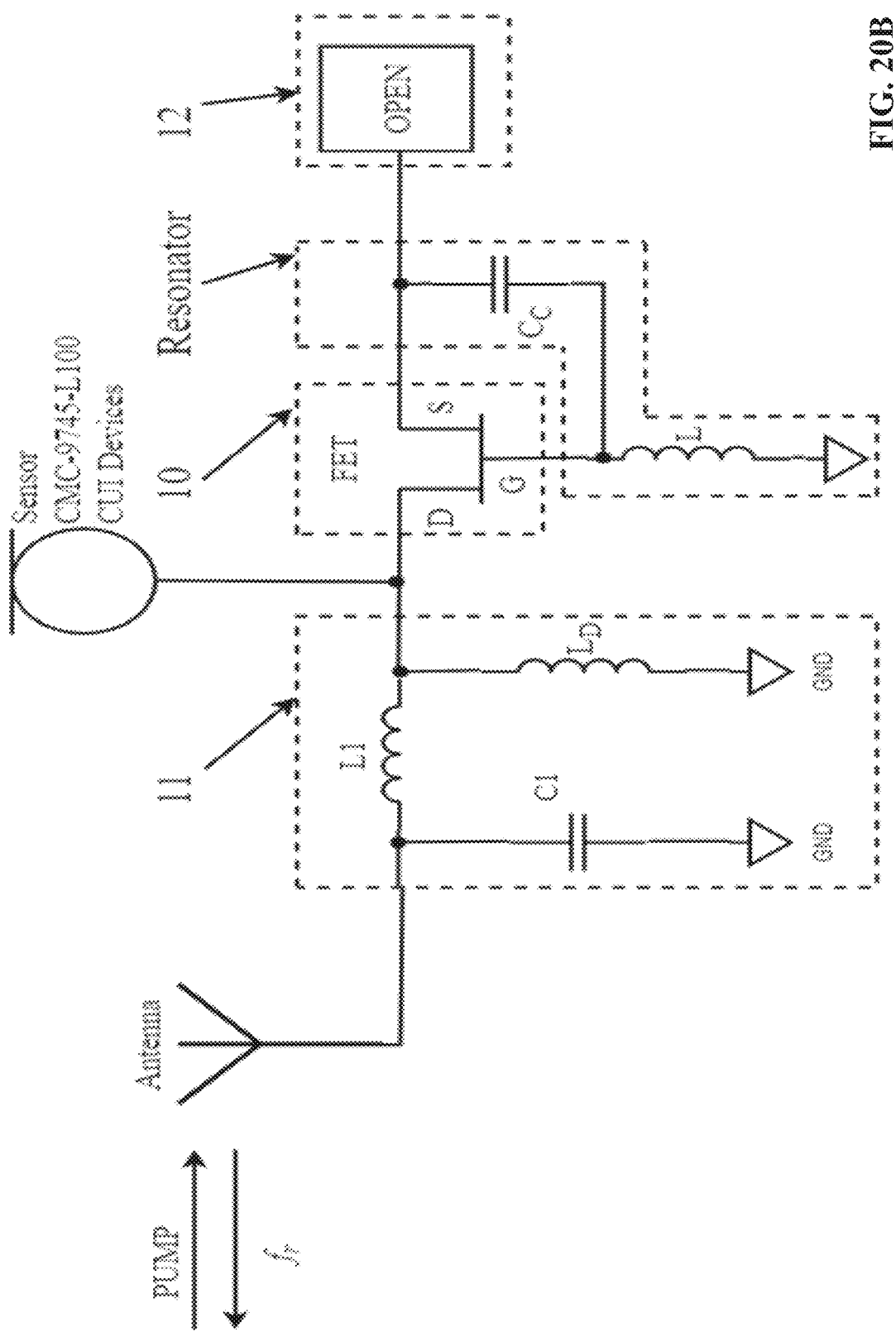
Figure 21A:
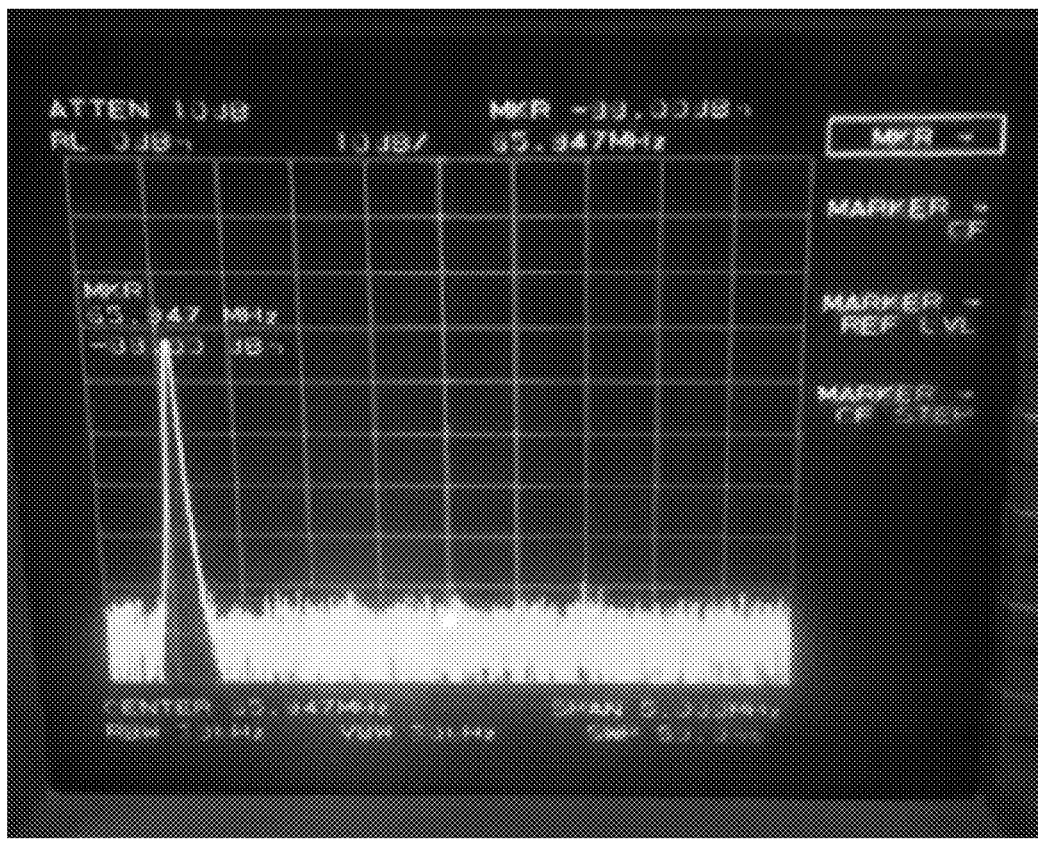
FIGS. 21A-21F show the test result of the wireless DC-free sensing information transmission circuit according to Example 6, where the voltage output of a sensor is simulated by a DC voltage having a step of 0.01 V, and the change in frequency $f_r$ of the output modulated microwave signal with the DC is shown.
Figure 21B:
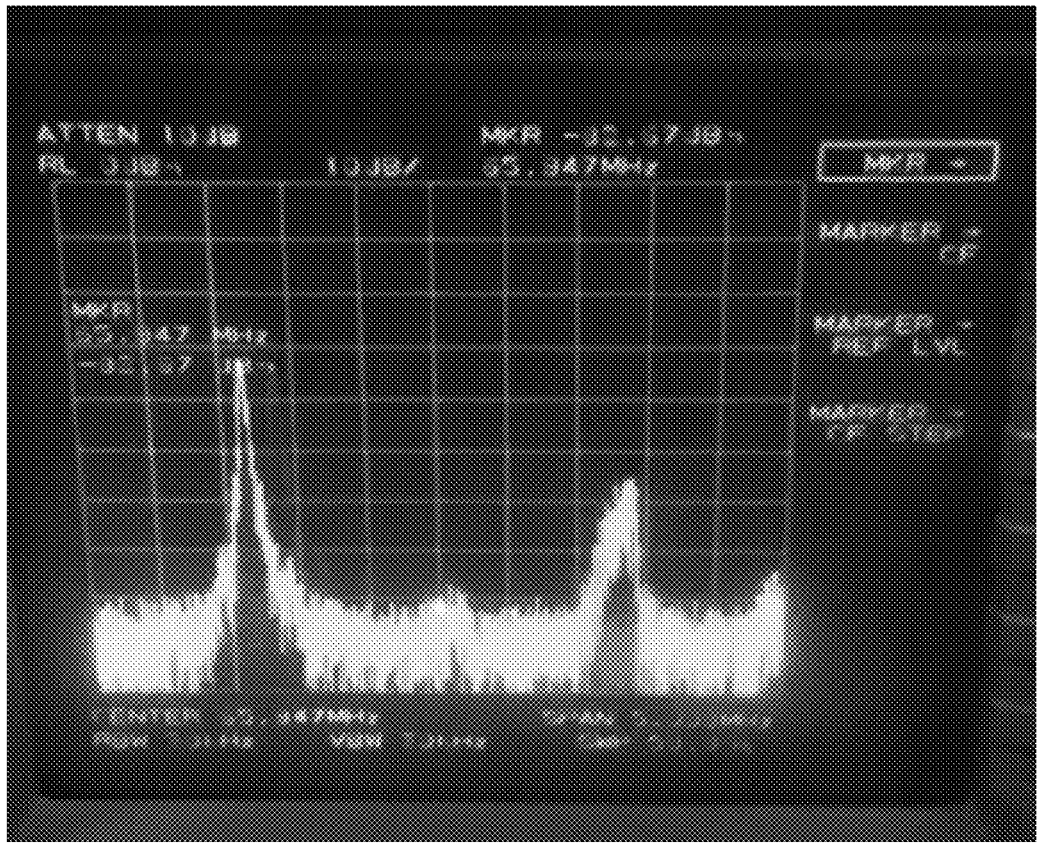
Figure 21C:
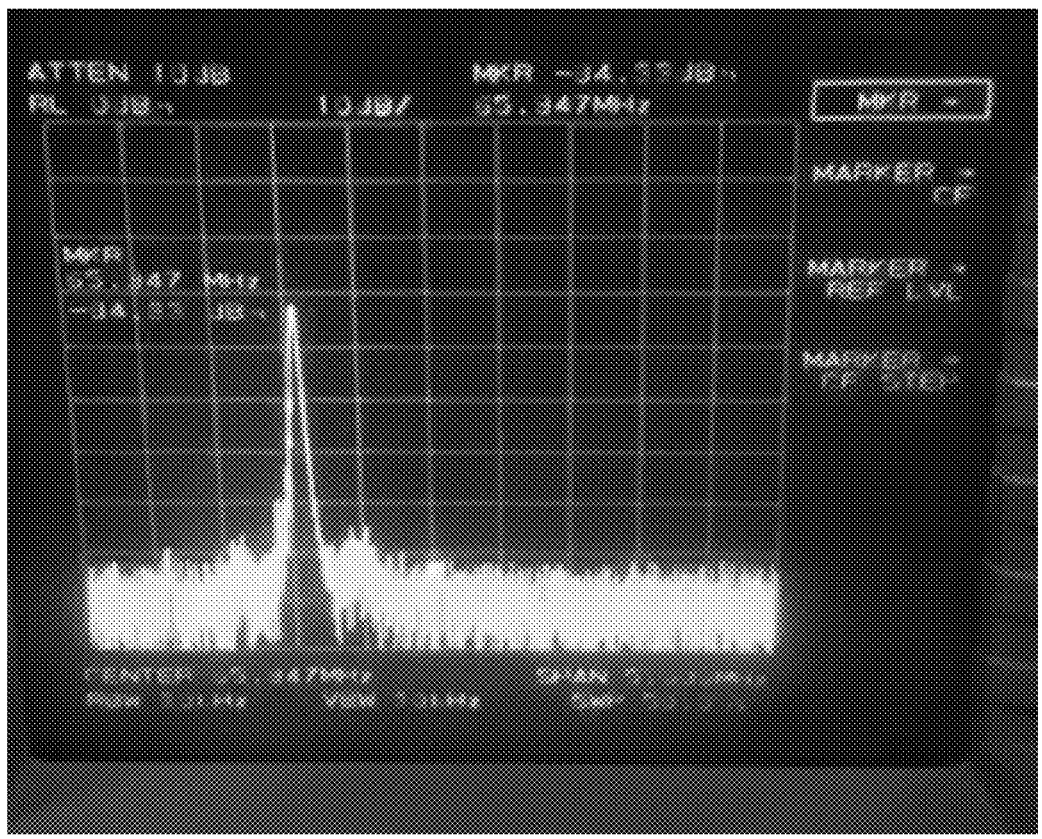
Figure 21D:
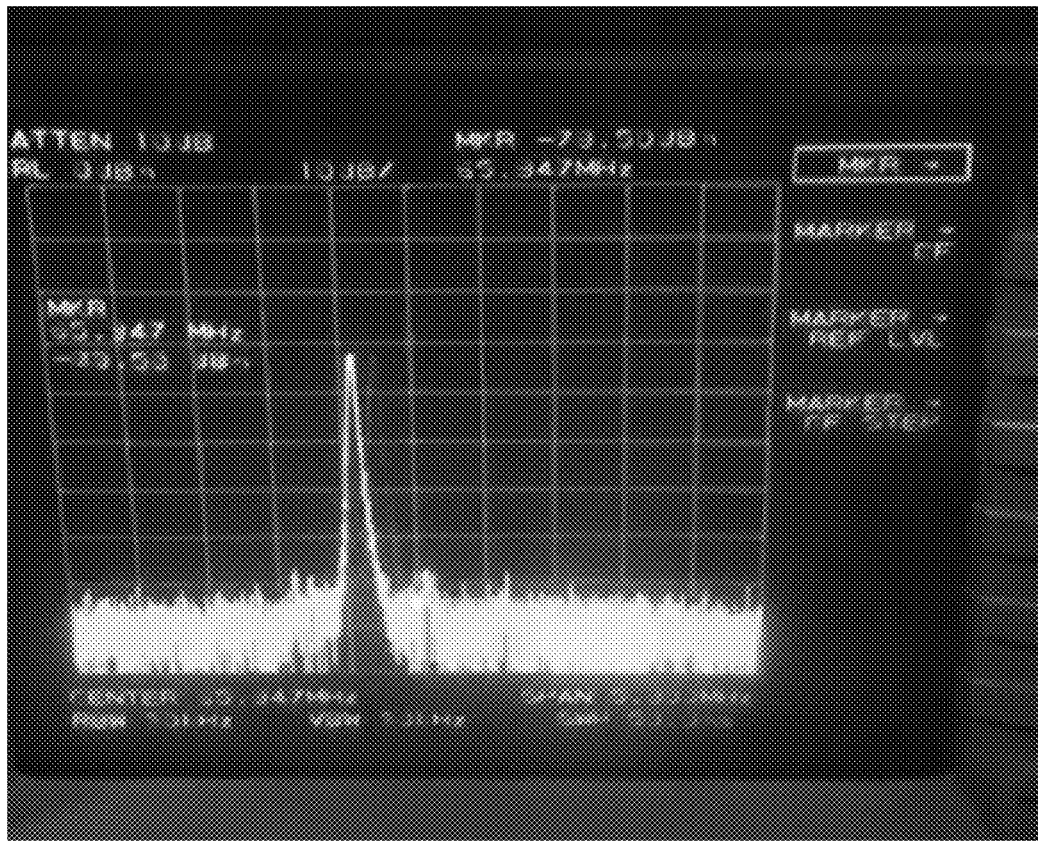
Figure 21E:
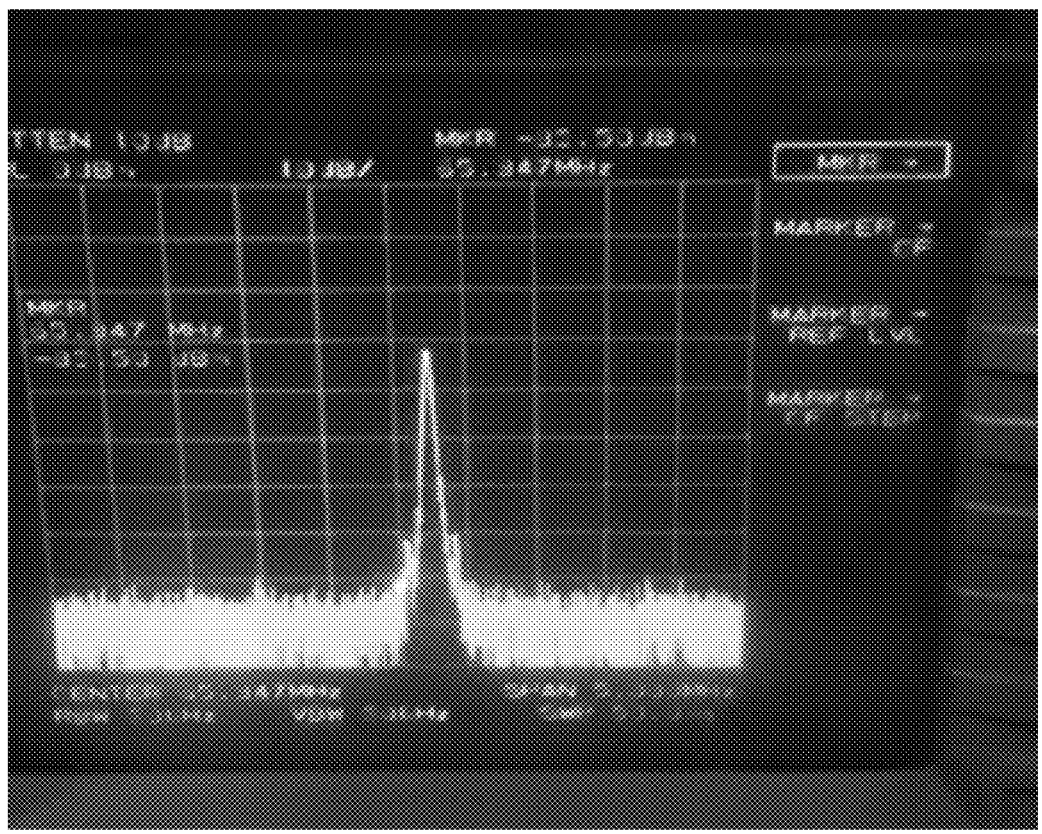
Figure 21F:
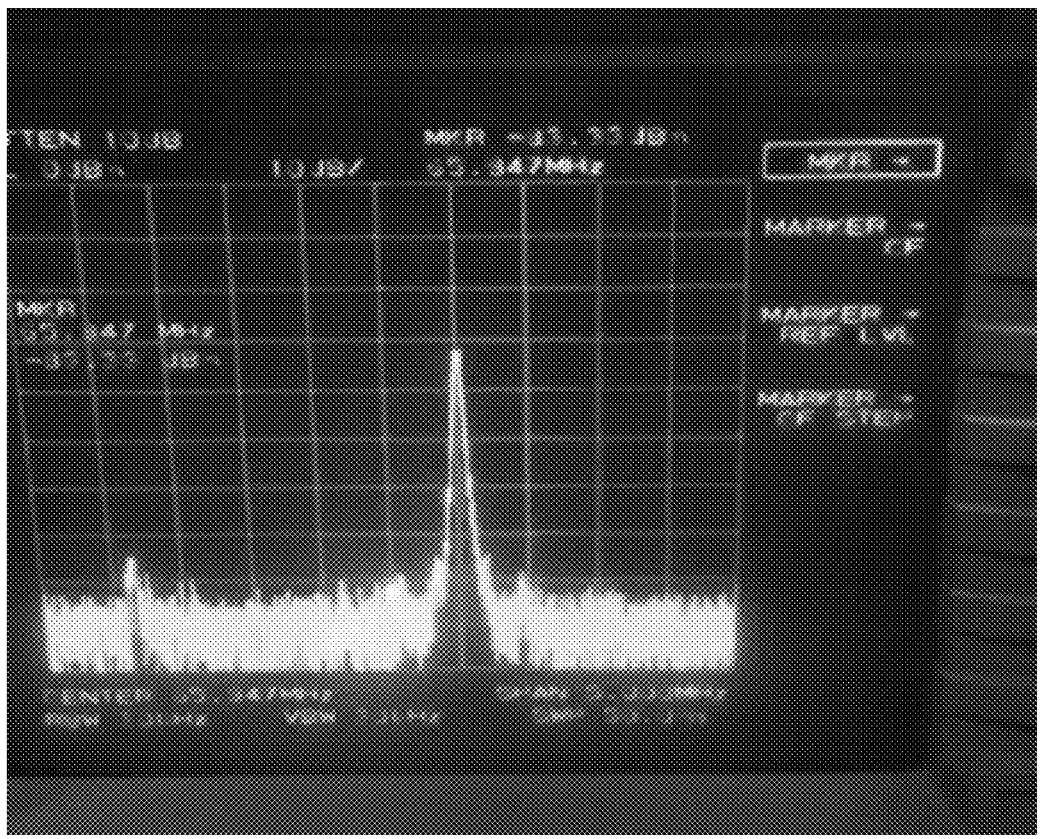

The specific structure diagram of the wireless DC-free sensing information transmission circuit in Example 6 is shown in FIG. 20B. The drain matching circuit comprises inductors $L_1$ and $L_D$ and a capacitor $C_1$. One end of the inductor $L_1$ is grounded by $C_1$, while the other end thereof is grounded by $L_D$. The resonant network comprises an inductor L and a capacitor $C_C$. The gate of the FET is grounded by the inductor L, and two ends of the capacitor $C_C$ are connected to the gate and source of the FET, respectively. The sensor is a CMC-9745-L100 CUI Device.

FET: E-pHEMT Transistor, SAV-541+, Mini-Circuits;
$C_1$: Ceramic capacitor, 6.2 pF, GQM1885C2A6R2CB01, muRata;
$C_C$: Ceramic capacitor, 510 pF, GQM2195C2A511JB12, muRata;
L: Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
Substrate: RO4350B, thickness: 0.02", Rogers.

FIGS. 21A to 21F show the test result of the wireless DC-free sensing information transmission circuit in Example 6, where the voltage output of the sensor is simulated by a DC voltage having a step of 0.01 V, and the change in frequency $f_r$ of the output modulated microwave signal with the DC is shown. It can be known from FIGS. 21A to 21F that the DC voltage U increases from 0.01 V to 0.06 V, and the output frequency $f_r$ increases from 64.047 MHz to 66.547 MHz. It indicates that the frequency linearly changes with the voltage.

The wireless DC-free sensing information transmission circuit according to the disclosure is simple in circuit structure. By receiving the pumped microwaves by an antenna and modulating the pumped microwaves according to the output voltage of the sensor, the wireless DC-free sensing information transmission is realized. The wireless DC-free sensing information transmission circuit can be widely applied in fields such as medicine, security, sensing, quantum technology and electronics.

Example 7

Figure 22A:
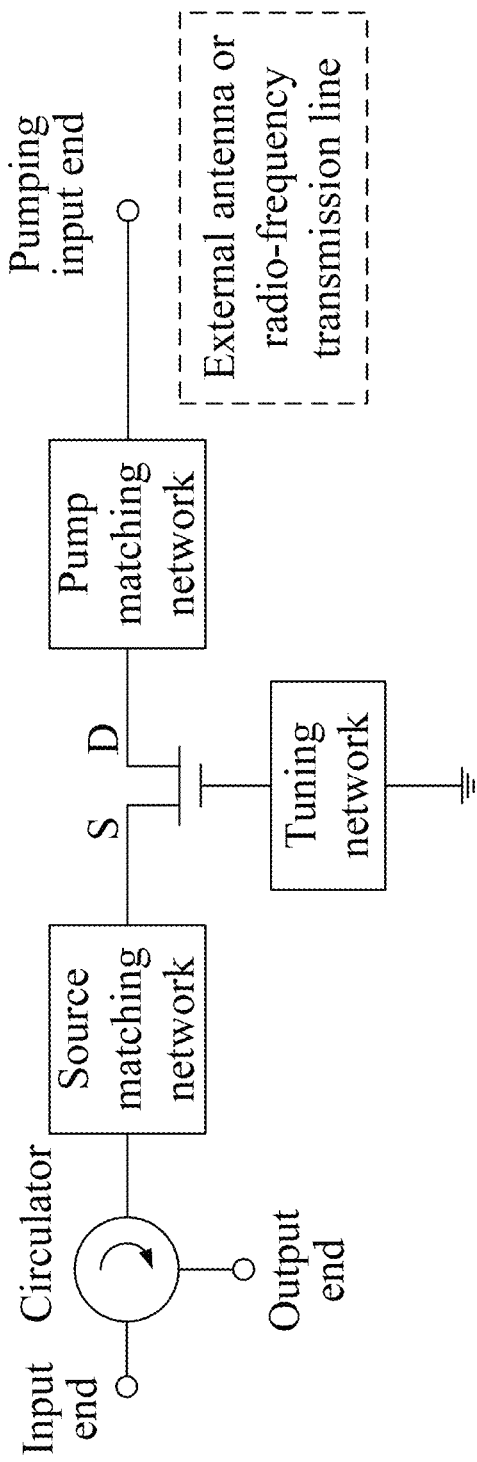
FIG. 22A is a schematic view of a reflective microwave amplifier according to the disclosure and FIG. 22B is a schematic view of a reflective microwave amplifier in Example 7.

FIG. 22A is a schematic view of the reflective microwave amplifier in this example. The reflective microwave amplifier comprises a circulator, a source matching network, a pump matching network, a heterojunction-containing transistor and a tuning network. The circulator is connected to an input end, an output end and an input end of the source matching network, an output end of the source matching network is connected to a source of the heterojunction-containing transistor, a gate of the heterojunction-containing transistor is grounded by the tuning network, and the pump matching network is connected to a drain of the heterojunction-containing transistor. The input signal is input from a port of the circulator, and the amplified signal is output from another port of the circulator. The source matching network functions to match the output impedance of the circulator with the impedance of the source of the transistor, so that the microwave signal to be amplified is fed into the transistor more efficiently and the amplified microwave signal is fed into the circulator more efficiently. The pump matching network matches the impedance of the drain with the impedance of the antenna or transmission line, so that the pumping energy is utilized more efficiently. The turning network functions to realize the controllability of the resonant frequency so as to adjust the operating frequency of the amplifier.

Figure 22B:
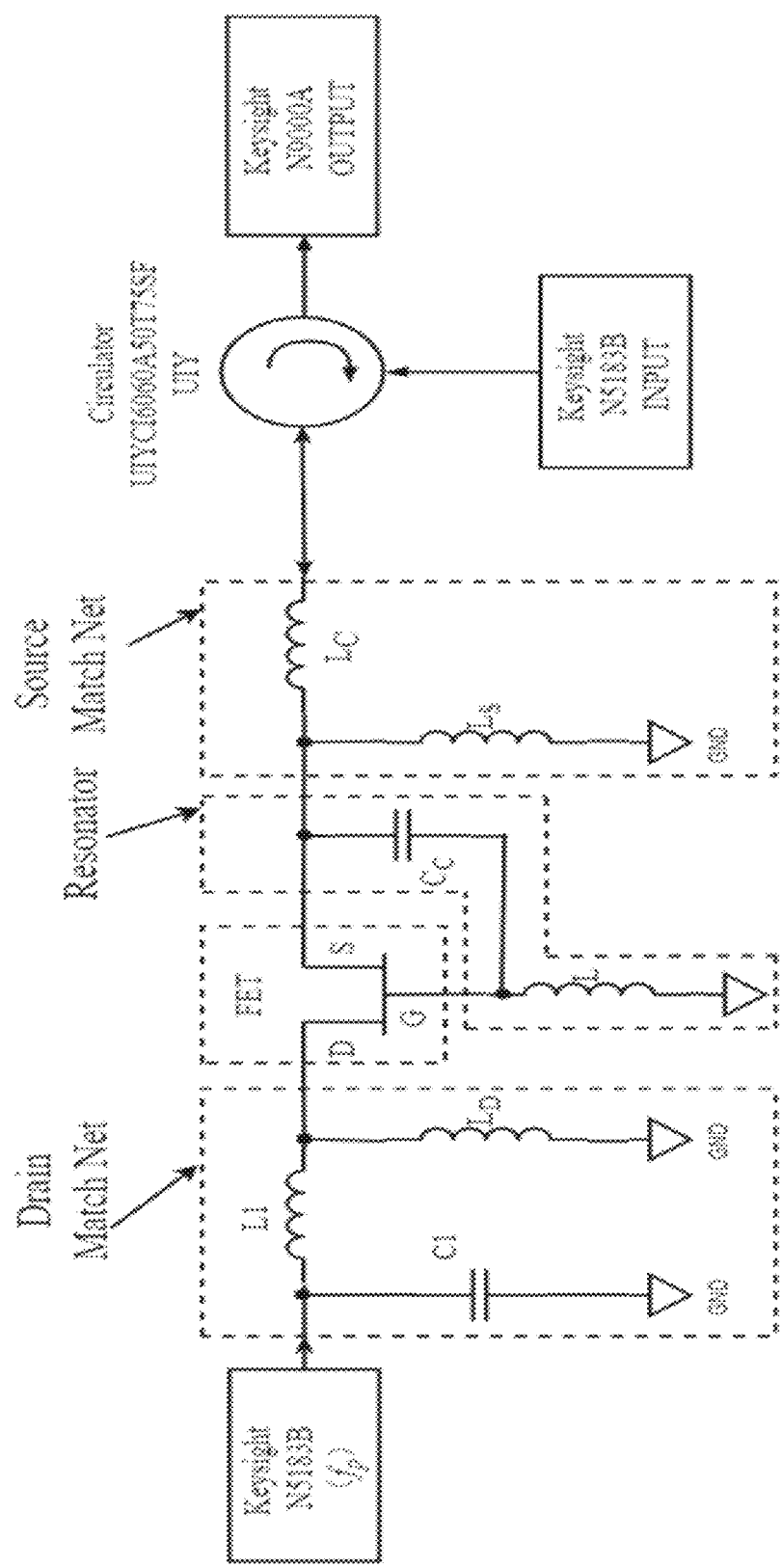

The specific structure diagram of the reflective microwave amplifier in Example 7 is shown in FIG. 22B. The pump matching network comprises inductors $L_1$ and $L_D$ and a capacitor $C_1$. One end of the inductor $L_1$ is grounded by $C_1$, while the other end thereof is grounded by $L_D$. The source matching network comprises inductors $L_C$ and $L_S$. One end of the inductor $L_C$ is grounded by $L_S$, while the other end thereof is connected to the circulator. The tuning network comprises an inductor L and a capacitor $C_C$. The gate of the FET is grounded by the inductor L, and two ends of the capacitor $C_C$ are connected to the gate and source of the FET, respectively.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata;
$C_C$: Ceramic capacitor, 510 pF, GQM2195C2A511JB12, muRata;
L and $L_C$: Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
Substrate: RO4350B, thickness: 0.02", Rogers.

Figure 24:
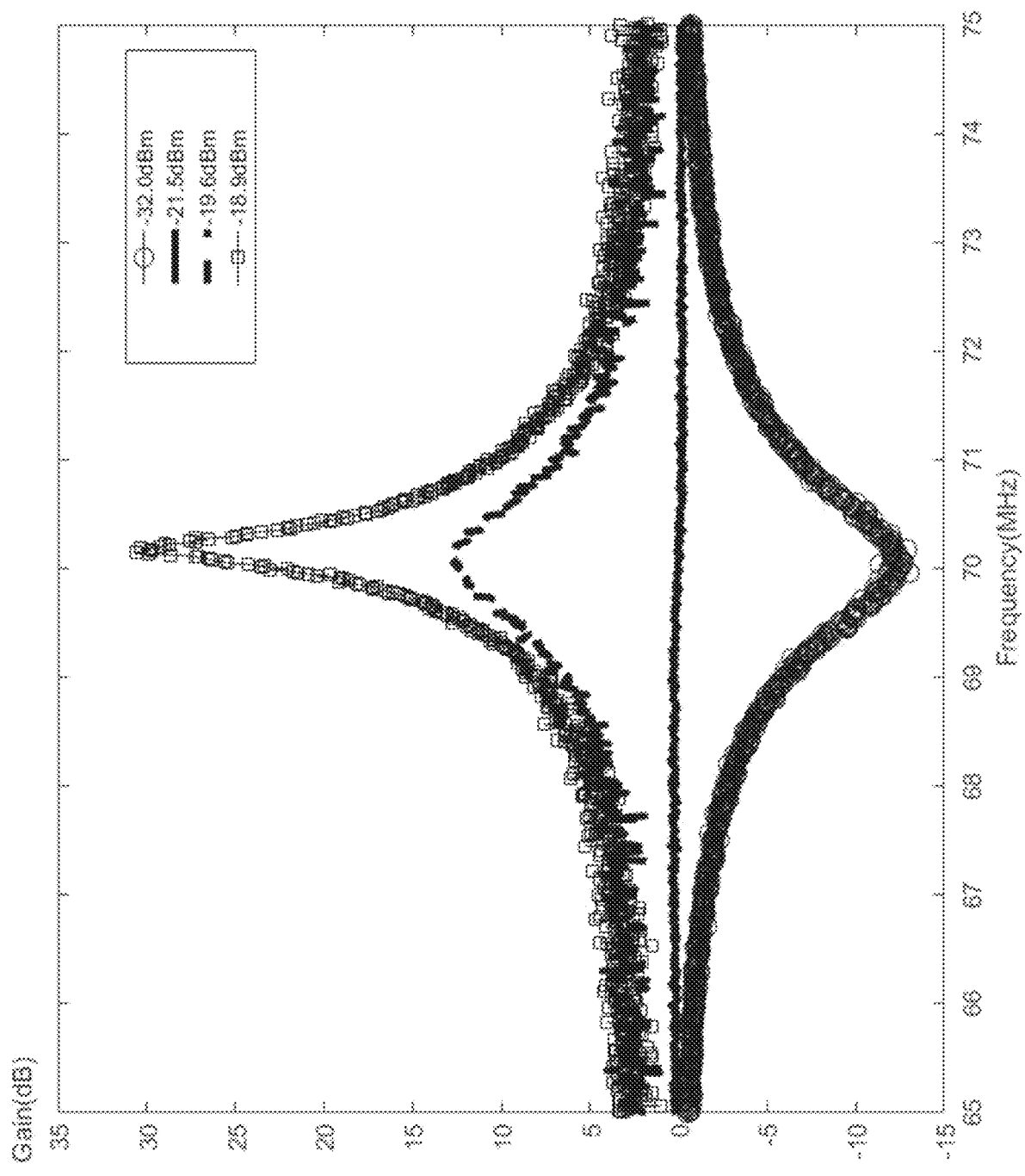
FIG. 24 is a measured curve of a vector network analyzer when the reflective microwave amplifier according to Example 7 of the disclosure operates at different pumping power.

FIG. 24 is a measured curve of a vector network analyzer when the reflective microwave amplifier in Example 7 operates at different pumping power. It can be known from FIG. 24 that, when the pumping power is −32.0 dBm, the device has no gain at 70 MHz, and attenuation is shown; when the pumping power is −21.5 dBm, the device has no gain at 70 MHz, and no attenuation is shown; when the pumping power is −19.6 dBm, the device has a gain of 12.4 dB at 70 MHz; and, when the pumping power is −18.9 dBm, the device has a gain of 31.2 dB at 70 MHz. It can be known that, by controlling the pumping power, the amplification can be realized and the amount of amplification is controllable.

Example 8

Figure 23A:
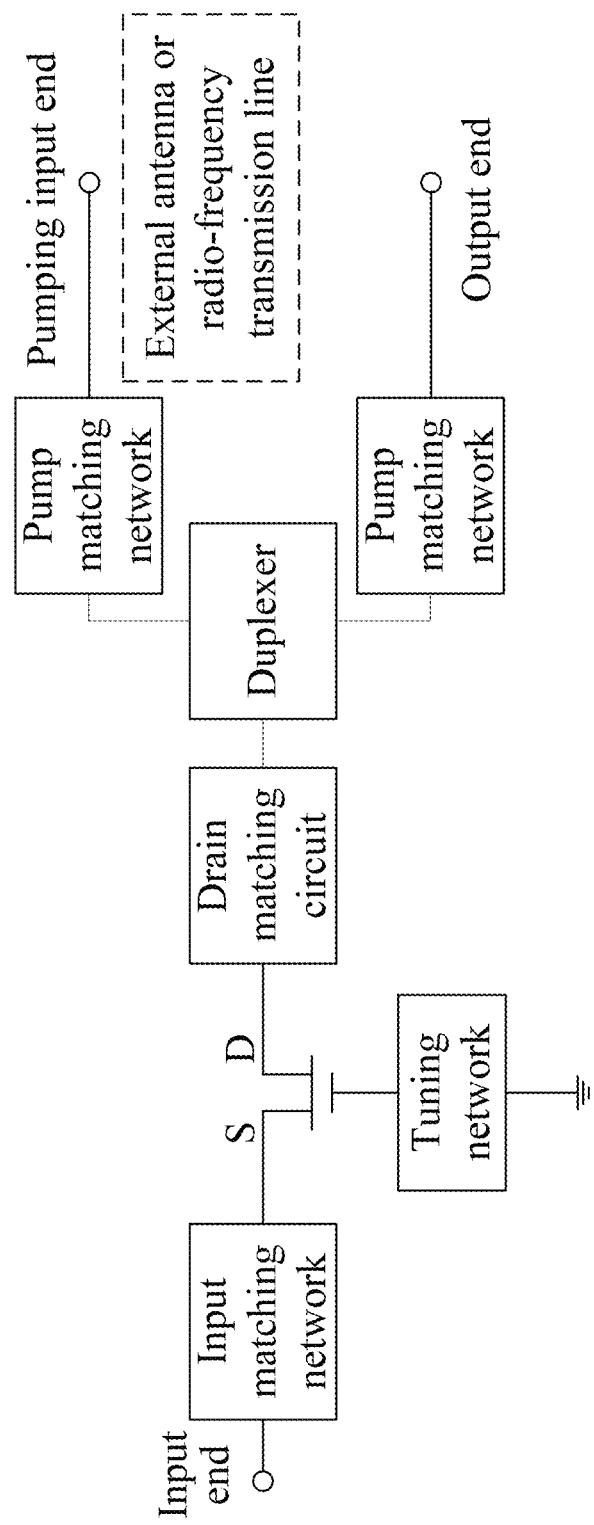
FIG. 23A is a schematic view of a pass-type microwave amplifier according to the disclosure and FIG. 23B is a schematic view of a pass-type microwave amplifier in Example 8.

FIG. 23A shows a pass-type microwave amplifier in this example. The pass-type microwave amplifier comprises an input matching network, a heterojunction-containing transistor, a drain matching network, a tuning network, a duplexer, a pump matching network and an output matching network. The input matching network is connected to a source of the heterojunction-containing transistor, a gate of the heterojunction-containing transistor is grounded by the tuning network, and a drain of the heterojunction-containing transistor is connected to one end of the drain matching network. The other end of the drain matching network is connected to a general port of the duplexer. Two branched ports of the duplexer are connected to the pump matching network and the output matching network, respectively. The input signal is passed to the input matching network, and the amplified signal is output by the output matching network. The input matching network functions to match the impedance of the input end with the impedance of the source of the transistor so that the microwave signal to be amplified is fed into the transistor more efficiently. The drain matching network matches the impedance of the drain with the impedance of the duplexer, to ensure the effective transmission of the amplified signal and the excellent spectral response of the duplexer. The pump matching network matches the impedance of the duplexer with the impedance of the antenna or transmission line, so that the pumping energy is utilized more efficiently. The output matching network matches the impedance of the duplexer with the impedance of the later-stage circuit or transmission line. The turning network functions to realize the controllability of the resonant frequency so as to adjust the operating frequency of the amplifier.

Figure 23B:
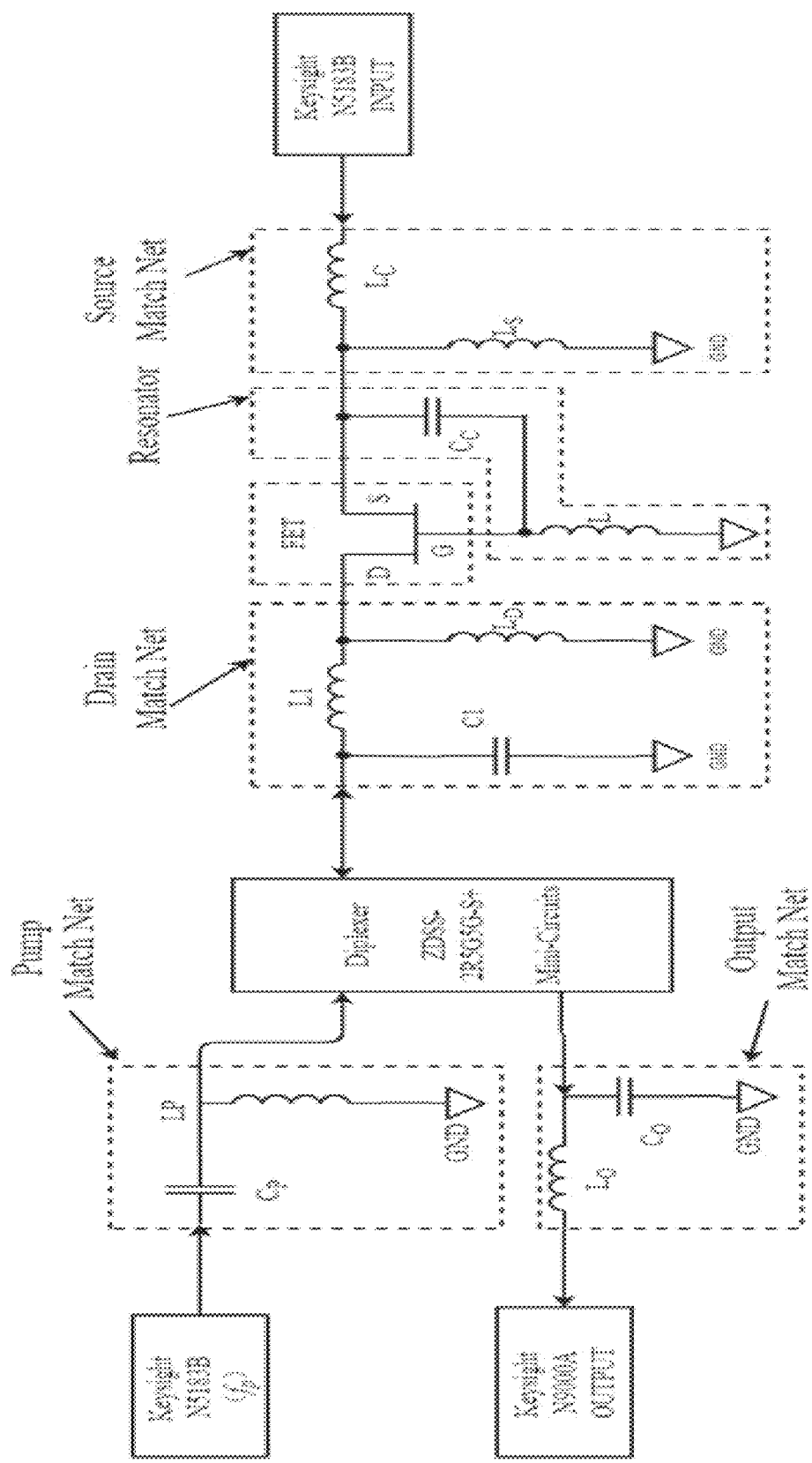

The specific structure diagram of the pass-type microwave amplifier in Example 8 is shown in FIG. 23B. The input matching network comprises inductors $L_C$ and $L_S$. One end of the inductor $L_C$ is grounded by $L_S$, while the other end is an input end. The drain matching network comprises inductors $L_1$ and $L_D$ and a capacitor $C_1$. One end of the inductor $L_1$ is grounded by $C_1$, while the other end thereof is grounded by $L_D$. The tuning network comprises an inductor L and a capacitor $C_C$. The gate of the FET is grounded by the inductor L, and two ends of the capacitor $C_C$ are connected to the gate and source of the FET, respectively. The pump matching network comprises an inductor Lp and a capacitor Cp. One end of the capacitor Cp is connected to a pumping input end, while the other end thereof is grounded by the inductor Lp. The output matching network comprises an inductor Lo and a capacitor Co. One end of the inductor Lo is connected to the output end, while the other end thereof is grounded by the capacitor Co.

FET: E-pHEMT Transistor, SAV-541+, Mini-Circuits;
$L_S$: Inductor, 1200 nH, 1008CS-122X_E, Coilcraft;
C1: Ceramic capacitor, 6.2 pF, GQM1885C2A6R2CB01, muRata;
$C_C$: Ceramic capacitor, 510 pF, GQM2195C2A511JB12, muRata;
$C_P$: Ceramic capacitor, 68 pF, GQM1885C1H680JB01, muRata;
$C_O$: Ceramic capacitor, 100 pF, GQM1885C1H101JB01, muRata;
L and $L_C$; Inductor, 680 nH, 1008CS-681X_E, Coilcraft;
$L_1$: Inductor, 180 nH, 1008CS-181X_E, Coilcraft;
$L_D$: Inductor, 150 nH, 1008CS-151X_E, Coilcraft;
$L_P$: Inductor, 22 nH, 1008CS-220X_E, Coilcraft;
$L_O$: Inductor, 82 nH, 1008CS-820X_E, Coilcraft;
Substrate: RO4350B, thickness: 0.02", Rogers.

The microwave amplifier according to the disclosure is simple in structure, can operate at room temperature without any strong magnetic field and any DC bias, and can be widely applied in fields such as medicine, security, sensing, quantum technology and electronics.

Example 9

Figure 25A:
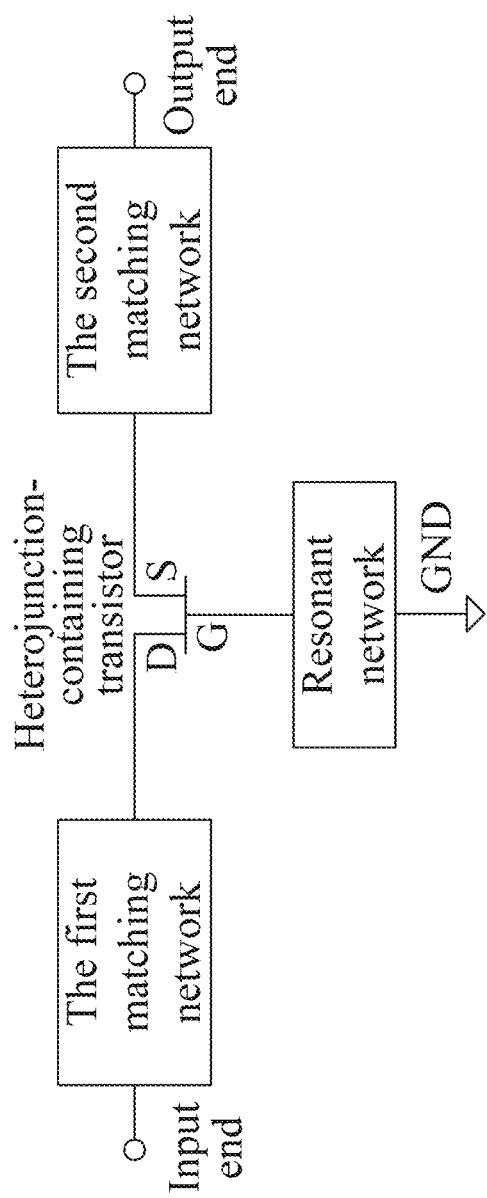
FIG. 25A is a schematic view and FIG. 25B is a circuit diagram of an RFID single-frequency-point tag circuit based on transistor passive frequency conversion according to Example 9 of the disclosure.
Figure 25B:
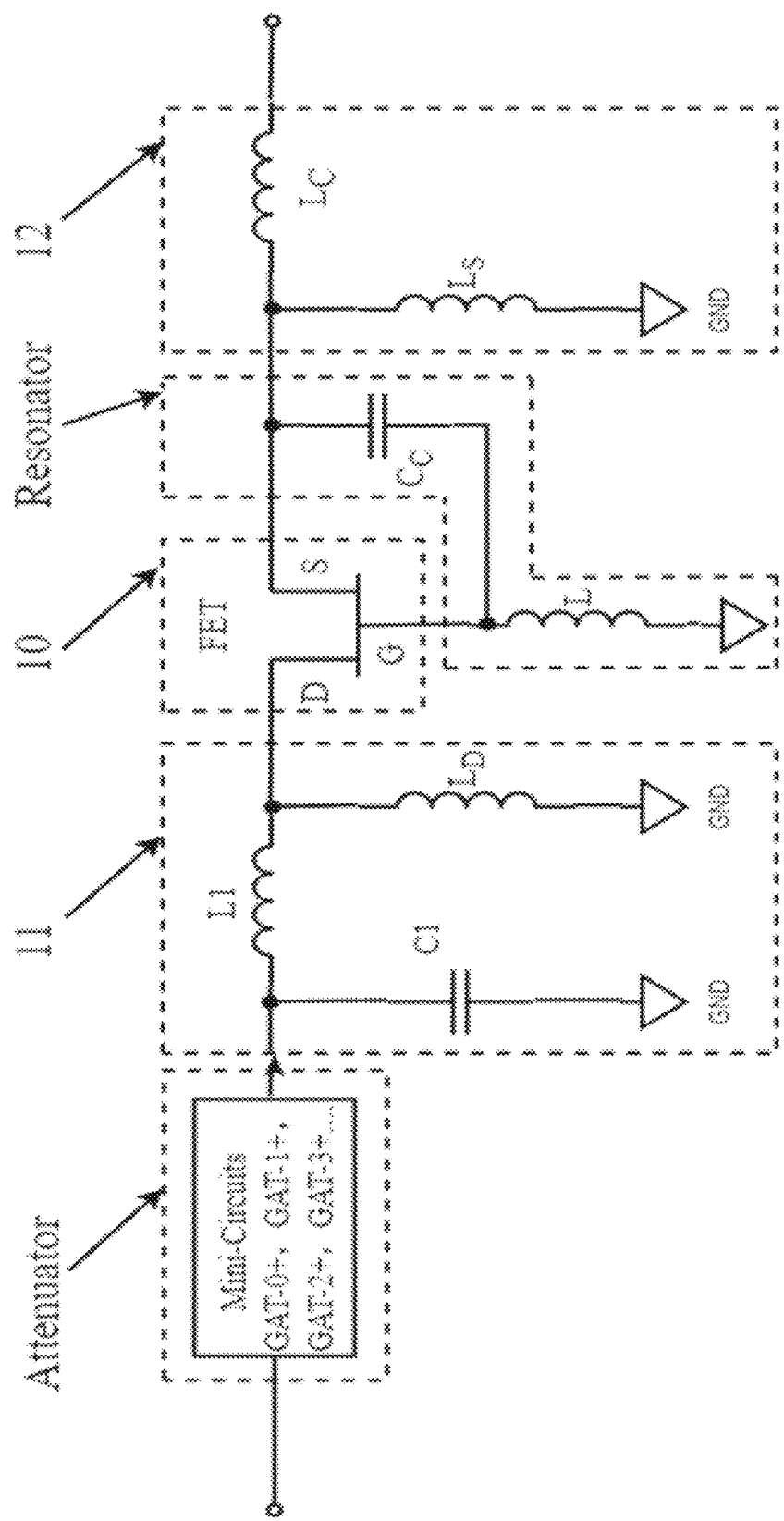

This example is an application in encoding an RFID single-frequency-point tag circuit based on transistor passive frequency conversion. In case of the same input frequency, the input power is made different by providing different attenuators GAT-0+, GAT-1+, GAT-2+, GAT-3+ or the like. FIG. 25B is a specific circuit diagram of the single-frequency-point tag circuit in this example. The input matching network comprises inductors $L_1$ and $L_D$ and a capacitor $C_1$. One end of the inductor $L_1$ is grounded by $C_1$, while the other end thereof is grounded by $L_D$. The output matching network comprises inductors $L_C$ and $L_S$. One end of the inductor $L_C$ is grounded by $L_S$, while the other end thereof is a signal output end. The resonant network comprises an inductor L and a capacitor $C_C$. The gate of the FET is grounded by the inductor L, and two ends of the capacitor $C_C$ are connected to the gate and source of the FET, respectively.

FET: E-pHEMT Transistor, SAV-541+, Mini-Circuits;
$L_S$: Inductor, 1200 nH, 1008CS-122X_E, Coilcraft;
$C_1$: Ceramic capacitor, 6.2 pF, GQM1885C2A6R2CB01, muRata
$C_C$: Ceramic capacitor, 510 pF, GQM2195C2A511JB12, muRata;
L: Inductor, 680 nH, 1008CS-681X_E, Coilcraft;
$L_C$: Inductor, 100 nH, 1008CS-101X_E, Coilcraft;
$L_1$: Inductor, 68 nH, 1008CS-680X_E, Coilcraft;
$L_D$: Inductor, 150 nH, 1008CS-151X_E, Coilcraft;
Substrate: RO4350B, thickness: 0.02", Rogers.

Figure 26:
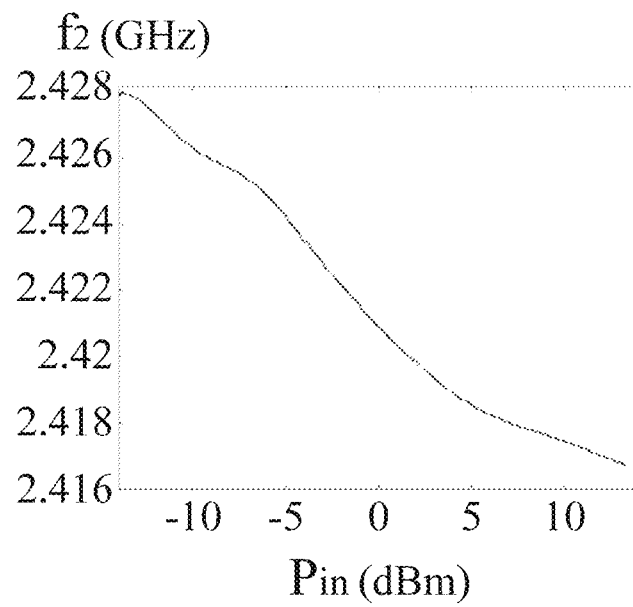
FIG. 26 shows the relationship between the input power Pin and the output frequency $f_2$ in the tag circuit according to Example 9 of the disclosure.
Figure 27:
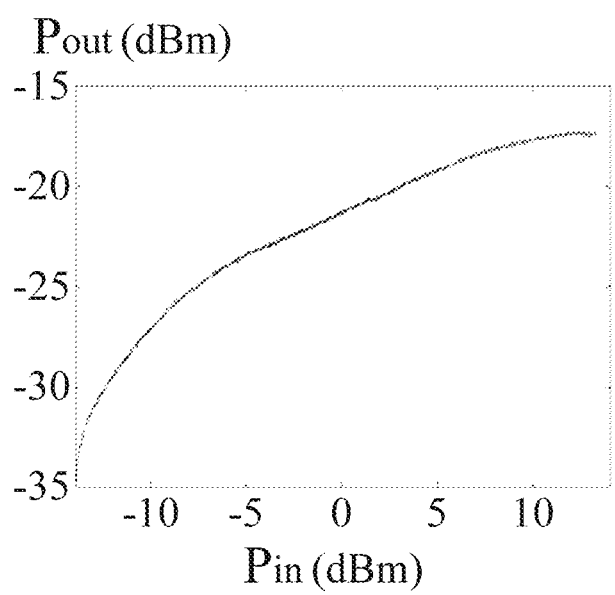
FIG. 27 shows the relationship between the input power Pin and the output power Pout in the tag circuit according to Example 9 of the disclosure.

In this example, an input resonance point $f_1$ is matched to 2.5 GHz, and an output resonance point $f_2$ is matched to 2.42 GHz. By maintaining the input frequency of 2.5 GHz to be constant and changing the input power Pin, the output frequency $f_2$ and the output power Pout at different power are measured. The test result is shown in FIGS. 26 and 27. It can be known from FIG. 26 that, the sensitivity of the RFID tag circuit is about −14 dBm, $f_2$ is negatively and basically linearly related to the power, and $f_2$ ranges from about 2.417 GHz to 2.428 GHz (since the energy level has a certain width, the value of $f_2$ is not a constant value, instead it is within a certain range). It can be known from FIG. 27 that the output power is about −35 to −13 dBm and is basically linearly related to the input power.

It can be known from FIGS. 26 and 27 that different output frequencies and different output power can be obtained by changing the input power. Based on this characteristic, different RFID tags are distinguished by providing attenuators having different amounts of attenuation at the input end of the RFID tag circuit, and the tags are identified according to the frequency of the acquired frequency conversion signals. Moreover, the RFID tags are encoded according to the one-to-one correspondence between the frequencies of the acquired frequency conversion signals and the tags.

In this method, the tag circuit is simple in structure, realizes the encoding of tags by a transistor passive frequency conversion technology without supplying DC, and is high in tag sensitivity. This method can be well applied in RFID systems.

Example 10

Figure 28A:
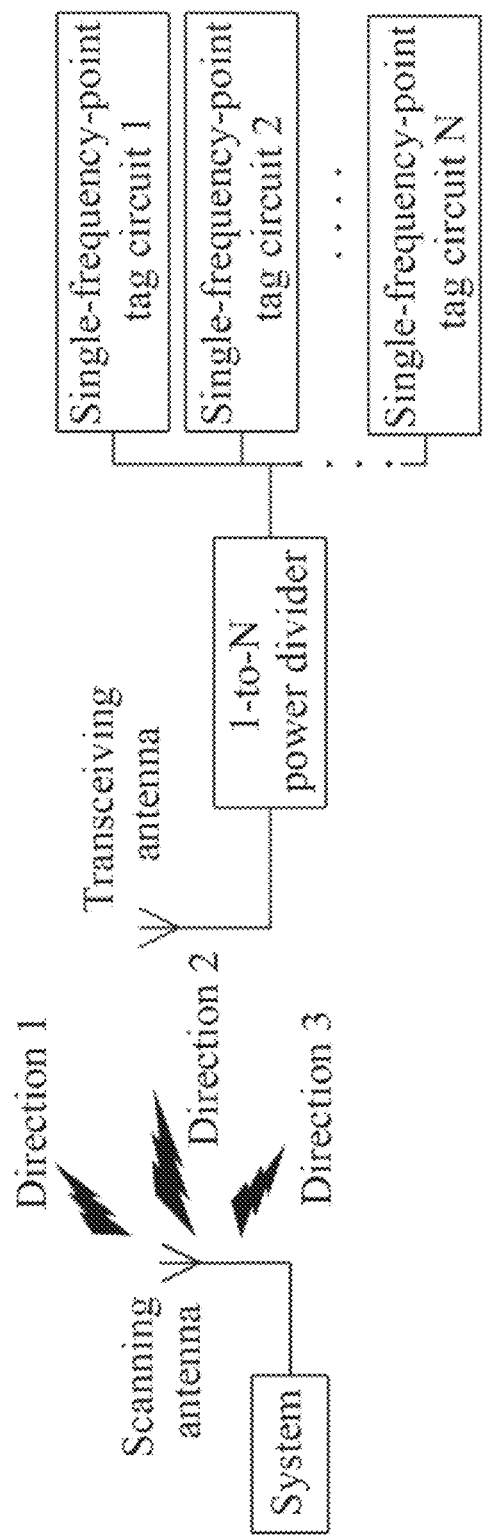
FIG. 28A is a structure diagram and FIG. 28B is a circuit diagram of a direction finding system based on a tag circuit according to Example 10 of the disclosure.

This example is an application of the tag circuit in Example 9 in direction finding. FIG. 28A is a structure diagram of a direction finding system based on the tag circuit in Example 9. The direction finding system comprises a scanning antenna, a 1-to-N power divider and a plurality of single-frequency-point tag circuits. The scanning antenna points to a target object carrying N single-frequency-point tag circuits. A signal received by a transceiving antenna is divided into N signals at different power by the 1-to-N power divider, which N signals are then input into N single-frequency-point tag circuits to generate N signals with different frequencies. The N signals with different frequencies are passed to the power divider, transmitted by the transceiving antenna, then received by the scanning antenna and then identified. In this way, the direction of the target object can be found. The scanning antenna can transmit the electromagnetic wave energy having a frequency of $f_1$ to everywhere in the space (direction 1, direction 2 and direction 3 shown in FIG. 28B). Only when the direction of the scanning antenna points to an RFID tag based on transistor passive frequency conversion (e.g., the direction 2), the RFID tag based on transistor passive frequency conversion can receive enough electromagnetic energy to convert electromagnetic wave energy having a frequency of $f_1$ into a frequency-irrelevant single-tone signal (having a frequency of $f_2$). This signal can be received by the scanning antenna and the frequency $f_2$ is identified. Thus, it is determined that there is an RFID tag based on transistor passive frequency conversion in the direction 2. When there is a plurality of RFID tags based on transistor passive frequency conversion in a space, the scanning antenna continuously changes the transmitting direction, then determines, according to the above principle, whether there is an RFID tag based on transistor passive frequency conversion in each direction, and identifies the RFID tag based on transistor passive frequency conversion in each direction according to the difference in the received frequency.

The 1-to-N power divider is an equal power divider or an unequal power divider. When the power divider is an equal power divider, each single-frequency-point tag circuit corresponds to one frequency point, and each target object is encoded according to the respective frequency point; and the direction finding system identifies a specific target and a target direction according to the codes. When the power divider is an unequal power divider, each single-frequency-point tag circuit is allowed to correspond to a group of output frequencies by adjusting the resonance points of the output matching network; and, the direction finding system identifies a target object according to the acquired frequency information.

Figure 28B:
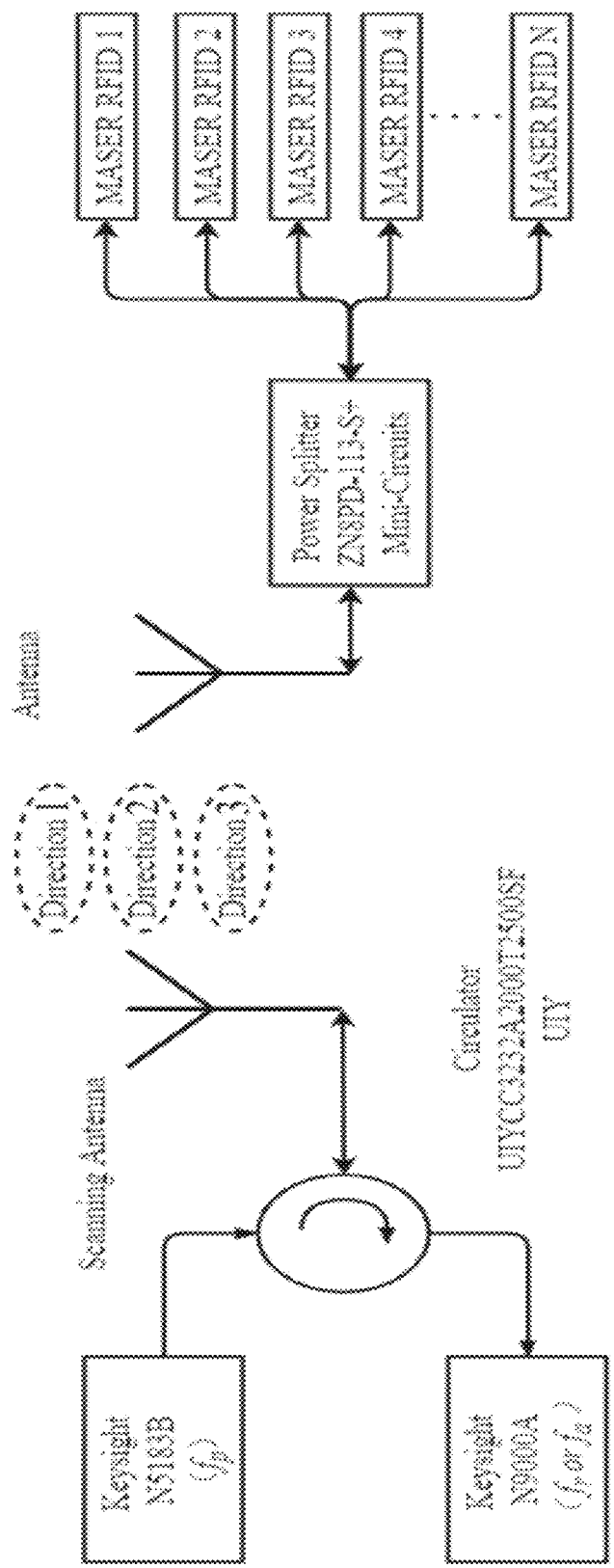

The specific circuit diagram in this example is shown in FIG. 28B.

It will be obvious to those skilled in the art that changes and modifications can be made, and therefore, the aim in the appended claims is to cover all such changes and modifications.

What is claimed is:

1. A semiconductor maser, comprising:
   a first matching network comprising an input end and an output end;
   a second matching network comprising an input end and an output end;
   a heterojunction-containing transistor comprising a drain, a source, and a gate; and
   a resonant network;
   wherein:
   the output end of the first matching network is connected to the drain;
   the input end of the second matching network is connected to the source;
   the gate is connected to the resonant network; and
   when in use, pumped microwaves are fed into the input end of the first matching network.

2. The semiconductor maser of claim 1, wherein the heterojunction-containing transistor is a heterojunction bipolar transistor or a field effect transistor (FET).

3. The semiconductor maser of claim 2, wherein the FET is a metal-oxide semiconductor field effect transistor (MOSFET) or a high electron mobility transistor (HEMT).

4. A passive frequency mixer, comprising an LO filter and a first network matching the LO filter, a band-pass filter and a second network matching the band-pass filter, a heterojunction-containing transistor, and a low-pass filter and a third network matching the low-pass filter, wherein the LO filter and an output end of the first network are connected to a drain of the heterojunction-containing transistor; the low-pass filter and an input end of the third network are connected to a source of the heterojunction-containing transistor; and a gate of the heterojunction-containing transistor is connected to the band-pass filter and the second network.

5. The passive frequency mixer of claim 4, wherein the heterojunction-containing transistor is a heterojunction bipolar transistor or a field effect transistor.

6. A method of manufacturing a radio-frequency microwave oscillator, comprising applying the semiconductor maser of claim 1, and controlling a resonant frequency of a resonant network in an oscillator according to an input power of pumped microwaves thereby achieving stable oscillation output.

7. A method of frequency stabilization of a semiconductor maser of claim 1, the method comprising selecting a power of fed pumped microwaves from a stable frequency range of the heterojunction-containing transistor, thereby achieving stable oscillation output.

8. A method for clock distribution, the method comprising applying the method of claim 7.

9. A microwave ranging system, comprising a master station instrument and a passive slave station instrument; wherein:
   the master station instrument comprises a signal source, an isolator, a power amplifier, a duplexer, a low-noise amplifier, a frequency detector and a master station instrument antenna; when in use, the signal source generates a microwave signal; the microwave signal is passed through the isolator and is then input into the power amplifier for amplification; the amplified signal is input into a first passband port of the duplexer; a main port of the duplexer is connected to the master station instrument antenna; a signal output from a second passband port is input into the low-noise amplifier; and a passive frequency conversion signal from the slave station instrument is amplified by the low-noise amplifier and then input into the frequency detector to detect the frequency; and
   the passive slave station instrument comprises a slave station instrument antenna and a passive frequency conversion device; when in use, the slave station instrument antenna receives a signal from the master station instrument and transmits a frequency conversion signal generated by the passive frequency conversion device; the passive frequency conversion device comprises a first matching network, a second matching network, a heterojunction-containing transistor and a resonant network; an output end of the first matching network is connected to a drain of the heterojunction-containing transistor; an input end of the second matching network is connected to a source of the heterojunction-containing transistor; a gate of the heterojunction-containing transistor is grounded by the resonant network; and, the microwave signal transmitted by the master station instrument antenna is fed into the passive frequency conversion device.

10. The microwave ranging system of claim 9, wherein a frequency of the signal output from the passive frequency conversion device is determined according to a frequency and power of the microwaves from the master station instrument received by the slave station instrument antenna.

11. The microwave ranging system of claim 9, wherein the heterojunction-containing transistor is a heterojunction bipolar transistor or a field effect transistor (FET).

12. A wireless DC-free sensing information transmission circuit, comprising a transceiving antenna, a drain matching circuit, an open-circuited line, a sensor, a heterojunction-containing transistor and a resonant network, wherein one end of the drain matching circuit is connected to the transceiving antenna while the other end thereof is connected to a drain of the heterojunction-containing transistor, and a source of the heterojunction-containing transistor is connected to the open-circuited line; when in use, a modulated microwave signal generated by transition of polaritons is reflected to the drain matching circuit and transmitted by the transceiving antenna; a gate of the heterojunction-containing transistor is grounded by the resonant network; an output end of the sensor is connected between the drain matching circuit and the heterojunction-containing transistor; and, the drain matching circuit receives pumped microwaves through the transceiving antenna, and transmits the microwave signal modulated by sensing information to the transceiving antenna.

13. The wireless DC-free sensing information transmission circuit of claim 12, wherein the heterojunction-containing transistor is a heterojunction bipolar transistor or a field effect transistor (FET).

14. A reflective microwave amplifier, comprising: a circulator, a source matching network, a pump matching network, a heterojunction-containing transistor, and a tuning network, wherein:
the circulator is connected to an input end, an output end and an input end of the source matching network; an output end of the source matching network is connected to a source of the heterojunction-containing transistor; a gate of the heterojunction-containing transistor is grounded by the tuning network; and the pump matching network is connected to a drain of the heterojunction-containing transistor; and
when in use, an input signal is passed to the source matching network through the circulator and is then matched by the source matching network and fed into the heterojunction-containing transistor; pumped microwaves are fed into the heterojunction-containing transistor through the pump matching network, so that polaritons in the energy level of the heterojunction-containing transistor are excited to a higher energy level; the tuning network adjusts the resonant frequency according to the frequency of the signal to be amplified, so that the input signal is amplified at a maximum amplification factor at low-noise; and, the amplified signal is passed through the source matching network and is then output from the output port of the circulator, thereby amplifying the power of the input signal.

15. The reflective microwave amplifier of claim 14, wherein the heterojunction-containing transistor is a heterojunction bipolar transistor or a field effect transistor (FET).

16. A pass-type microwave amplifier, comprising: an input matching network, a heterojunction-containing transistor, a drain matching network, a tuning network, a duplexer, a pump matching network, and an output matching network, wherein:
the input matching network is connected to a source of the heterojunction-containing transistor, a gate of the heterojunction-containing transistor is grounded by the tuning network, and a drain of the heterojunction-containing transistor is connected to one end of the drain matching network; the other end of the drain matching network is connected to a general port of the duplexer; two branched ports of the duplexer are connected to the pump matching network and the output matching network, respectively; and
when in use, an input signal is matched by the input matching network and then fed into the heterojunction-containing transistor; pumped microwaves are passed through the pump matching network and are then fed into the heterojunction-containing transistor, so that polaritons in the energy level of the heterojunction-containing transistor are excited to a higher energy level; the tuning network adjusts the resonant frequency according to the frequency of the signal to be amplified, so that the polaritons excited to the higher energy level transition to a lower energy level specified by the resonant frequency of the tuning network so as to radiate energy; due to the frequency of the input signal, stable excited radiation will occur during the transition of the polaritons excited to the higher energy level to the specified energy level, so that the signal is amplified at low-noise; and, the amplified signal is output by the output matching network.

17. The pass-type microwave amplifier of claim 16, wherein the heterojunction-containing transistor is a heterojunction bipolar transistor or a field effect transistor (FET).

18. An encoding method using a semiconductor maser of claim 1 as an RFID single-frequency-point tag circuit based on transistor passive frequency conversion, wherein the single-frequency-point tag circuit comprises a first matching network, a heterojunction-containing transistor, a second matching network, and a resonant network; pumped microwaves are fed into an input end of the first matching network; an output end of the first matching network is connected to a drain of the heterojunction-containing transistor; a source of the heterojunction-containing transistor is connected to the second matching network; and the gate of the heterojunction-containing transistor is grounded by the resonant network; the method comprises:
changing a resonant frequency of the resonant network, adjusting a frequency of output frequency points to correspond to different tags, encoding, and performing radio-frequency identification.

19. An encoding method using a semiconductor maser of claim 1 as an RFID single-frequency-point tag circuit based on transistor passive frequency conversion, wherein the single-frequency-point tag circuit comprises a first matching network, a heterojunction-containing transistor, a second matching network and a resonant network; pumped microwaves are fed into an input end of the first matching network; an output end of the first matching network is connected to a drain of the heterojunction-containing transistor; a source of the heterojunction-containing transistor is connected to the second matching network; and the gate of the heterojunction-containing transistor is grounded by the resonant network; the method comprises:
inputting pumped microwaves with same frequency and different powers, allowing the pumped microwaves to pass through the heterojunction-containing transistor and the second matching network and outputting frequency points with different frequencies corresponding to different tags, encoding, and performing radio-frequency identification.

20. An encoding method based on an RFID multiple-frequency-point tag circuit based on transistor passive frequency conversion, wherein the multiple-frequency-point tag circuit comprises a plurality of single-frequency-point tag circuits; each of the single-frequency-point tag circuits comprises a first matching network, a heterojunction-containing transistor, a second matching network and a resonant network; pumped microwaves are fed into an input end of the first matching network; an output end of the first matching network is connected to a drain of the heterojunction-containing transistor; a source of the heterojunction-containing transistor is connected to the second matching network; a gate of the heterojunction-containing transistor is grounded by the resonant network; each single-frequency-point tag circuit is encoded by the method of claim 18.

21. An encoding method based on an RFID multiple-frequency-point tag circuit based on transistor passive frequency conversion, wherein the multiple-frequency-point tag circuit comprises a plurality of single-frequency-point tag circuits; each of the single-frequency-point tag circuits comprises a first matching network, a heterojunction-containing transistor, a second matching network and a resonant network; pumped microwaves are fed into an input end of the first matching network; an output end of the first matching network is connected to a drain of the heterojunction-containing transistor; a source of the heterojunction-containing transistor is connected to the second matching network; a gate of the heterojunction-containing transistor is grounded by the resonant network; each single-frequency-point tag circuit is encoded by the method of claim 19.

22. A method of direction finding comprising applying the encoding method of claim 20.

\* \* \* \* \*